United States Patent
Yamaguchi et al.

(10) Patent No.: US 7,112,519 B2
(45) Date of Patent: Sep. 26, 2006

(54) SEMICONDUCTOR DEVICE MANUFACTURING METHOD

(75) Inventors: Hitoshi Yamaguchi, Nisshin (JP); Yoshiyuki Hattori, Aichi-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/950,526

(22) Filed: Sep. 28, 2004

(65) Prior Publication Data

US 2005/0035401 A1 Feb. 17, 2005

Related U.S. Application Data

(62) Division of application No. 10/411,373, filed on Apr. 11, 2003, now abandoned.

(51) Int. Cl.
*H01L 21/04* (2006.01)
(52) U.S. Cl. ............... 438/524; 438/510; 257/330
(58) Field of Classification Search ............. 438/330, 438/270–271, 140, 589, 454, 259
See application file for complete search history.

(56) References Cited

U.S. PATENT DOCUMENTS

| | | | |
|---|---|---|---|
| 5,773,849 A | 6/1998 | Harris et al. | |
| 5,963,807 A | 10/1999 | Ueno | |
| 6,174,773 B1 | 1/2001 | Fujishima | |
| 6,479,876 B1 | 11/2002 | Deboy et al. | |
| 6,621,132 B1 | 9/2003 | Onishi et al. | |
| 6,700,175 B1 | 3/2004 | Kodama et al. | |
| 2002/0074596 A1* | 6/2002 | Suzuki et al. | 257/330 |

FOREIGN PATENT DOCUMENTS

| | | | |
|---|---|---|---|
| JP | 2000-260984 | | 9/2000 |
| JP | 2001-111050 | | 4/2001 |
| JP | 2001-244461 | | 9/2001 |
| JP | 2001-332726 | | 11/2001 |
| JP | 2002-184985 | * | 6/2002 |
| JP | 2002-203963 | * | 7/2002 |

* cited by examiner

*Primary Examiner*—Nathan J. Flynn
*Assistant Examiner*—Ahmed N. Sefer
(74) *Attorney, Agent, or Firm*—Posz Law Group, PLC

(57) ABSTRACT

A semiconductor device includes: an $n^+$ type drain region; an n type drift region that connects with the $n^+$ type drain region; a p type body region; a $n^+$ type source region that connects with the p type body region; and a gate electrode that is provided, with being covered by a gate insulation film, in a gate trench that penetrates the p type body region. The semiconductor further includes: a p type silicon region that adjoins the n type drift region; and an n type silicon region provided in a region almost including a carrier passage that connects the n type drift region and the p type body region. Here, the p type silicon region and the p type body region directly connect with each other.

19 Claims, 18 Drawing Sheets

SEMICONDUCTOR DEVICE MANUFACTURING METHOD

CROSS REFERENCE TO RELATED APPLICATIONS

This application is a divisional application of U.S. application ser. No. 10/411,373, which was filed on Apr. 11, 2003 now abandoned.

FIELD OF THE INVENTION

The present invention relates to a semiconductor device and its manufacturing method. In particular, the semiconductor device is, for instance, used as MOS FET with having high withstanding voltage and low ON resistance.

BACKGROUND OF THE INVENTION

A semiconductor device in JP-A-2000-260984 is shown as a related art in FIG. 42. The semiconductor device 1 includes: an $n^+$ type (first conductivity type) drain region 2; an n type (first conductivity type) drift region 6 connecting with the $n^+$ type drain region 2; a p type (second conductivity type) body region 12; an $n^+$ type source region 14 connecting with the p type body region 12; a gate electrode 20 filled with being covered by an insulation film 18 in a gate trench 13 that penetrates the p type body region 12; a p type silicon region (semiconductor region) 8 adjoining the n type drift region 6; and an $n^-$ type (first conductivity type) silicon region 11 covering the n type drift region 6 and the p type silicon region 8. It further includes a p type silicon region 22 connecting a rear portion of the p type body region 12 and an upper and rear portion of the p type silicon region 8. The n type drift region 6 and the p type silicon region 8 form alternate layers that are orthogonal to the surface of the drain region. The alternate layers constitute super-junction structure 4.

Applying positive electric voltage to the gate electrode 20 in the semiconductor device 1 leads to forming an n type channel 12a in the p type body region 12. A carrier (electron) thereby flows from the $n^+$ type source region 14 through the n type channel 12a in the p type body region 12 and the n type drift region 6 to the $n^+$ type drain region 2.

Connecting the gate electrode 20 to ground results in canceling the channel 12a from the p type body region 12. The semiconductor 1 is thereby turned off. In the semiconductor device 1, depletion layers are widened towards the n type drift region 6 and the p type silicon region 8 from a pn junction 7 between the n type drift region 6 and the p type silicon region 8. The n type drift region 6 and the p type silicon region 8 are completely occupied with the depletion layers, so that withstanding voltage (break-down voltage) between the $n^+$ type source region 14 and the $n^+$ type drain region 2 is attained.

Conventional power MOS structure (not shown) does not include a super-junction structure 4. Withstanding voltage is therefore determined by depletion layers extended from a pn junction between the n type drift region and a p type body region. Typically, impurity concentration is lowered in the n type drift region in comparison with the p type body region, so that the n type drift region is completely occupied with the depletion layer. Required withstanding voltage is thereby attained.

When the drift region is formed of the super-junction structure 4 as shown in FIG. 42, the depletion layers extend towards the n type drift region 6 from the pn junctions 7 that are located in both sides of the drift region 6. To attain a certain withstanding voltage, a semiconductor device with the super-junction structure 4 can include a more impurity in the n type drift region 6 than a semiconductor without the super-junction structure 4. This results in obtaining a low ON-resistance semiconductor device with having the same certain withstand voltage.

In manufacturing a semiconductor device, a mask for forming the gate trench 13 may shift horizontally (in parallel with the surface of the drain region 2), or etching for forming the gate trench 13 may be practiced more deeply (orthogonally to the surface of the drain region 2) than a required depth. These manufacturing problems arise even at the present day when micro-fabrication is much progressed. In this case, without forming the $n^-$ type silicon region 11, the trench may reach the n type drift region 6 or the p type silicon region 8 through a bottom of the p type body region 12. Here, the carrier that passes through the n type channel in the p type body region forms a channel also in the p type silicon region 8 due to MOS effect before reaching the n type drift region 6. Channel resistance in the p type silicon region 8 is thereby increased, so that the ON resistance of the semiconductor device 1 is increased.

In the above semiconductor device 1, disposing the $n^-$ type silicon region covering the n type drift region 6 and the p type silicon region 8 prevents the ON resistance from increasing due to the manufacturing problems.

However, when the $n^-$ type silicon region 11 thoroughly isolates the p type silicon region 8 from the p type body region 12, the p type silicon region 8 is in floating electric potential. In this condition, when, during withstanding voltage, positive voltage is applied to the $n^+$ type drain region 2 and the $n^+$ type source region is connected to ground, voltage for extending the depletion layers towards the n type drift region 6 and the p type silicon region 8 may not be sufficiently applied to the pn junction between them. A characteristic of withstanding voltage may thereby become unstable. For preventing the p type silicon region 8 from remaining in the floating electric potential, the p type silicon region 22 is provided in a rear portion of the semiconductor device 1. It is for connecting an upper rear portion of the p type silicon region 8 and a rear portion of the p type body region 12 as shown in FIG. 42.

Here, the p type body region 12 and the p type silicon region 8 must be electrically connected through the silicon region 22 via a long electric current passage. During withstanding voltage, a virtual pnp transistor is formed among the p type body region 12, the $n^-$ type silicon region 11, and the p type silicon region 8. This pnp transistor sometimes shifts to an ON state due to voltage drop deriving from the long electric current passage. As a result, during withstanding voltage, a leak current may flow from the p type silicon region 8 through the $n^-$ type silicon region 11 to the p type body region 12.

SUMMARY OF THE INVENTION

It is an object of the present invention to provide a semiconductor device having a shorten electric current passage between a second semiconductor region and a body region. This is realized under condition where an ON resistance is prevented from increasing due to horizontal misalignment of masking or vertical misalignment of depth control during forming a gate trench. Furthermore, here, the second semiconductor region is not moved to floating electric potential, so that a characteristic of withstanding voltage is maintained to be stable.

To achieve the above object, a semiconductor device includes: a first-conductivity type drain region; a first-conductivity type drift region that connects with the drain region; a second-conductivity type body region; a first-conductivity type source region that connects with the body region; a gate electrode that is provided, with being covered by a gate insulation film, in a gate trench that penetrates the body region. The semiconductor device further includes: a first semiconductor region that is a first-conductivity type and provided between the drift region and the body region; and a second semiconductor region that is a second-conductivity type and connects with the drift region and the body region.

This structure prevents an ON resistance from increasing due to horizontal misalignment of masking or vertical misalignment of depth control during forming a gate trench. Since the second semiconductor region directly connects with the body region, the second semiconductor region is not moved to floating electric potential. Furthermore an electric current passage can be shortened between the second semiconductor region and the body region. No necessity of independently disposing a p type silicon region for connecting the second semiconductor region and the body region leads to realization of downsizing, weight saving, and high integration in the semiconductor device.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
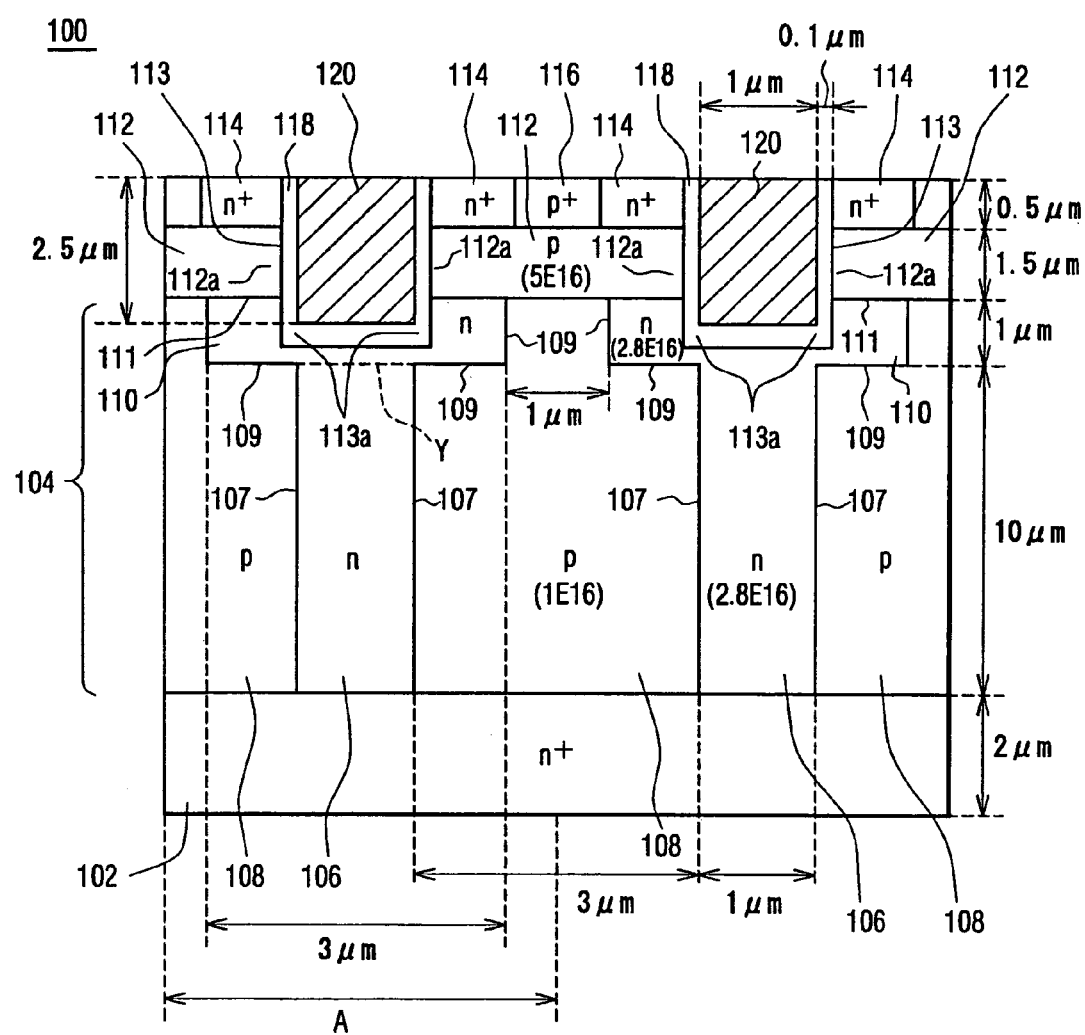
FIG. 1 is a sectional view of a semiconductor device according to a first embodiment of the present invention.

A vertical semiconductor device 100 of a first embodiment of the present invention is shown in a sectional view in FIG. 1. A width A shown in a lower area of FIG. 1 shows a unit structure that is repeatedly formed in a horizontal direction (from side to side) of FIG. 1.

The semiconductor device 100 forms metal oxide semiconductor (MOS) field effect transistor (FET) structure of a U trench type (U-shaped gate trench 113). The semiconductor device 100 is used for a motor of a vehicle, or a power converter or power control of electrical appliances for home use.

The semiconductor device 100 includes a drain region 102, a drift region 106, a silicon region 108, a body region 112, an upper silicon region 110, a source region 114, and a gate 120.

The drain region 102 is an n$^+$ type (first conductivity type). It is 2 μm thick (vertical direction (from bottom to top) in FIG. 1).

The drift region 106 is an n type (first conductivity type) and connects with the n$^+$ type drain region 102. At an ON state of the semiconductor device 100, a carrier (electron) flows through the n type drift region 106. During withstanding voltage, the drift region 106 is occupied with a depletion layer along with the silicon region 108. The n type drift region 106 has an n type impurity of $2.8 \, E \, 16 \, cm^{-3}$ and is 1 μm wide (horizontal direction in FIG. 1) and 10 μm thick. These values are selected for enabling the n type drift region 106 to be occupied with the depletion layer during withstanding required voltage.

The silicon region 108 is a p type (second conductivity type) and connects with the n type drift region 106. During withstanding voltage, the silicon region 108 is occupied with the depletion layer along with the drift region 106. The p type silicon region 108 has a p type impurity of $1 \, E \, 16 \, cm^{-3}$ and is 3 μm wide and 10 μm thick. These values are selected for enabling the p type silicon region 108 to be occupied with the depletion layer during withstanding required voltage.

The n type drift region 106 and the p type silicon region 108 form alternate layers that are orthogonal to the surface of the drain region 102 and parallel to a carrier passage where the carrier flows. The alternate layers form so called super-junction structure 104. In other words, the n type drift region 106 and the p type silicon region 108 are jointed with a pn junction. The pn junctions are horizontally-repeatedly disposed at intervals in the (vertical) alternate layers.

The body region 112 is a p type and connects with the p type silicon region 108. During the ON state of the vertical semiconductor device 100, an n type channel is formed in a region 112a inside the p type body region 112. The p type body region 112 has a p type impurity of $5 \, E \, 16 \, cm^{-3}$ and is 1.5 μm thick. A body contact region 116 that is 0.5 μm thick and an p$^+$ type is formed on the surface of the p type body region 112.

An upper silicon region 110 of an n type is disposed in a region that almost includes the carrier passage between the n type drift region 106 and the p type body region 112. The n type upper silicon region 110 is disposed between an upper plane (dotted line Y in FIG. 1) of the n type drift region 106 and a lower plane of the p type body region 112.

The n type upper silicon region 110 connects with the n type drift region 106. In this embodiment, the n type upper silicon region 110 and the n type drift region 106 are formed as one united deposited layer (film) by a first manufacturing method explained later. The n type upper silicon region has an n type impurity of $2.8 \, E \, 16 \, cm^{-3}$, which is similar to that of the n type drift region 106. However, the n type impurity concentration can be different between the n type upper silicon region 110 and the n type drift region 106. For instance, the n type upper silicon region 110 can have the n type impurity of $1 \, E \, 16 \, cm^{-3}$.

The n type upper silicon region 110 connects with p type body region 112 and the region 112a where the n type channel is formed inside the p type body region 112. The n type upper silicon region 110 is disposed between the n type drift region 106 and the bottom of the gate trench 113. The n type upper silicon region 110 is 3 μm wide and 1 μm thick, and wider than the gate trench 113. The n type upper silicon region 110 has a broader width than the n type drift region 106 and the gate trench 113 by almost same length in each of both ends of the width. The n type upper silicon region 110 surrounds a bottom of the gate trench 113 and lower end portions 113a of the side walls of the gate trench 113.

The n type upper silicon region 110 is favorably not less than 0.5 μm by considering vertical control misalignment in depth of the gate trench 113 through anisotropic etching. By contrast, the n type upper silicon region 110 should be enough thin (in detail, not greater than 1.5 μm) so that the n type upper silicon region 110 is thoroughly or nearly occupied with the depletion layer during withstanding voltage. In detail, it should be not greater than 1.5 μm thick although the thickness is affected by required withstanding voltage and impurity concentration around the own region.

The source region 114 of an n$^+$ type is 0.5 μm thick and connects with the surface of the p type body region 112.

The gate electrode 120 is filled, with being covered with the U-shaped gate insulation film 118, in the gate trench 113 that penetrates the p type body region 112. The gate electrode 120 is 1 μm wide and 2.5 μm deep (thick). The gate insulation film 118 is 0.1 μm wide that is determined based on required threshold voltage.

Operation of the vertical semiconductor device 100 of the first embodiment will be explained below. The n$^+$ type drain region 102 is applied the positive voltage to while the n$^+$ type source region 114 and the p$^+$ type body contact region 116 are connected to ground. Here, when the vertical semiconductor device 100 is shifted into an ON state or the gate electrode 120 is applied positive voltage to, an electron inside the p type body region 112 congregates in the region 112a to form the n type channel. The electron that is supplied from the n$^+$ type source region 114 thereby flows through the n type channel 112a, the n type upper silicon region 110, the n type drift region 106 to reach the n⁺ type drain region 102. In other words, at the ON state of the vertical semiconductor device 100, electric current flows from the drain region 102 to the source region 114.

In the above structure of the vertical semiconductor device 100, the electron flows out from the n type channel 112a through the n type upper silicon region 110 (in particular a region along the gate trench 113) and then the n type drift region 106. It does not flow into the p type silicon region 108, so that an n type channel is not formed in the p type silicon region 108. This prevents the ON resistance from increasing. The above structure is effectively used for a semiconductor device having withstanding voltage of not greater than 200 V. In this semiconductor device, a channel resistance of the n type channel formed inside the p type silicon region 108 is much contributory to overall ON resistance of the semiconductor device.

When withstanding voltage is measured between the n⁺ type source region 114 and the n⁺ type drain region 102, voltage applied to the n⁺ type drain region 102 is gradually increased from 0 V while applying 0 V to the gate electrode 120 and the n⁺ type source region 114. Here, with increasing applied voltage, the depletion layers are widened from three pn junctions 107, 109, and 111 towards the regions 106, 108, 110, and 112. At required withstanding voltage, the regions 106 and 108 are thoroughly occupied with the depletion layers. Regions where the super-junction structure 104 is formed are completely occupied with the depletion layers, so that high withstanding voltage can be attained. Furthermore, the p type silicon region 108 connects with the p type body region 112, and the p⁺ type body contact region 116 is formed on the surface of the p type body region 112. The p type silicon region 108 is thereby not in a state of floating electric potential. This results in stabilizing a characteristic of the withstanding voltage.

Figure 42:
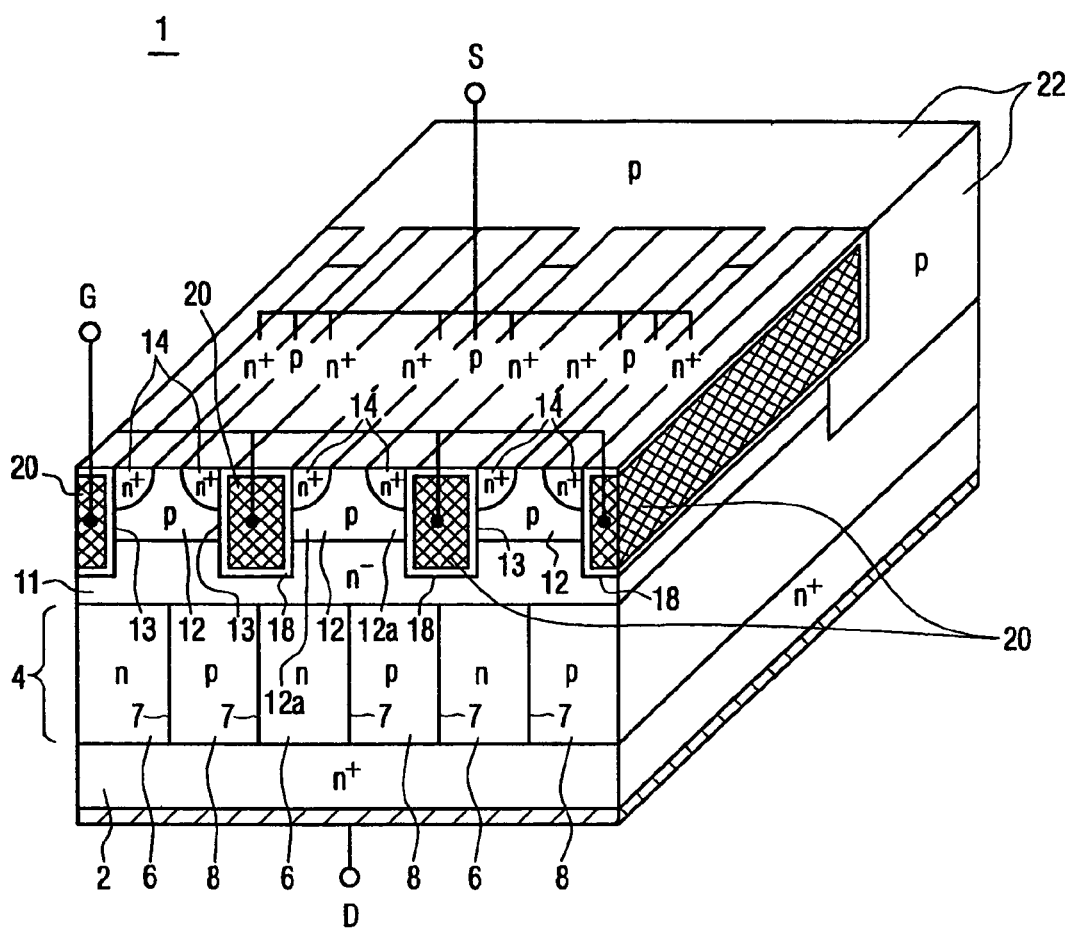
FIG. 42 is a perspective view showing a semiconductor device of a related art.

Thus, in the vertical semiconductor device 100 of the first embodiment, the p type silicon region 22 of the related art shown in FIG. 42 is unnecessary. The p type silicon region 108 shown in FIG. 1 is not in the state of floating electric potential without disposing the p type silicon region 22 for connecting the p type silicon region 8 and the p type body region 12 in the related art. The characteristic of the withstanding voltage is thereby stabilized. The p type silicon region 108 directly connects with the p type body region 112, so that an electric current passage can be shortened between the p type silicon region 108 and the p type body region 112. No necessity of independently disposing the p type silicon region for connecting as shown in FIG. 42 leads to realization of downsizing, weight saving, and high integration in the vertical semiconductor device 100.

Disposing the n type upper silicon region 110 having a broader width enables the n type drift region 106 to maintain a narrow width. Impurity concentration of the n type drift region 106 can be thereby high while simultaneously maintaining the high withstanding voltage. This results in realizing a semiconductor device that has low ON resistance while maintaining the high withstanding voltage.

Simulation result of the characteristic of the vertical semiconductor device 100 of the first embodiment will be explained below. Here, the impurity concentrations are as follows: the n type drift region 106 has an n type impurity of $3.0 \text{ E } 16 \text{ cm}^{-3}$; the p type silicon region 108 has a p type impurity of $3.0 \text{ E } 16 \text{ cm}^{-3}$; and the n type upper silicon region 110 has an n type impurity of $2.8 \text{ E } 16 \text{ cm}^{-3}$. The p type silicon region 108 has width of 1 µm. These values of the above impurity concentrations and the thickness are different from the values explained in FIG. 1. Under the above conditions, the withstanding voltage is about 235 V, while the ON resistance is about $0.078 \text{ } \Omega \text{ mm}^2$ at $V_G=15$ V.

(First Manufacturing Method Instance)

Various manufacturing methods for the first embodiment will be explained. As shown FIG. 2, an n type layer 106 is deposited over an n⁺ type substrate (n⁺ type drain region) 102, for instance, with an epitaxial growth method. A trench 106a is formed for penetrating the n type layer 106 to reach the n⁺ type drain region 102 with an anisotropic etching (e.g., reactive ion etching (RIE)) through masking by resist (photo sensitive film) as shown in FIG. 3. As a result, the n type layer 106 becomes an n type drift region 106.

Figure 4:
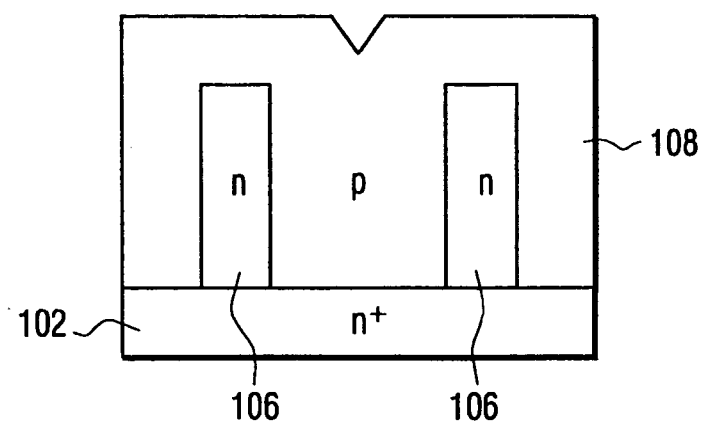
FIG. 4 is a view explaining part (3) of the first manufacturing method of the semiconductor device according to the first embodiment.

A p type layer 108 is then deposited, for instance with the epitaxial growth method, inside the trench 106a to form alternate layers of the n type layer 106 and the p type layer 108 and, consecutively an overhead p type layer 108 over the alternate layers as shown in FIG. 4.

Figure 5:
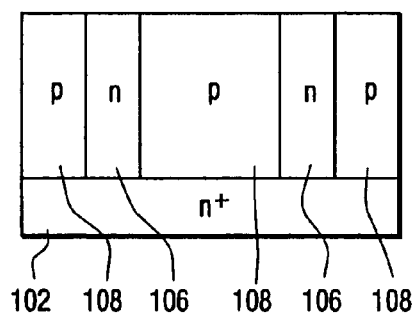
FIG. 5 is a view explaining part (4) of the first manufacturing method of the semiconductor device according to the first embodiment.

The overhead p type layer 108 is polished and planarized till an upper plane of the n type drift region 106, for instance with chemical mechanical polishing (CMP) as shown in FIG. 5.

Figure 6:
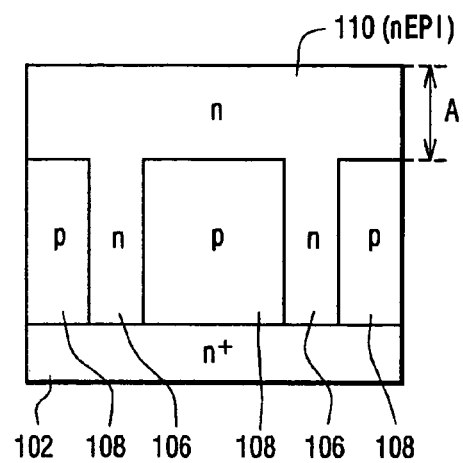
FIG. 6 is a view explaining part (5) of the first manufacturing method of the semiconductor device according to the first embodiment.
Figure 7:
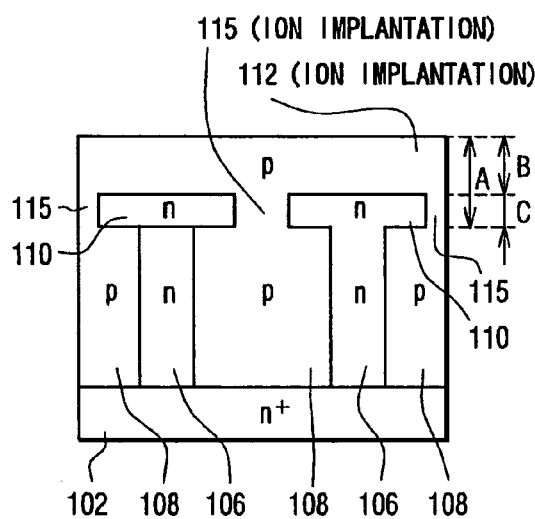
FIG. 7 is a view explaining part (6) of the first manufacturing method of the semiconductor device according to the first embodiment.

An n type layer 110 having thickness A is then deposited, for instance with the epitaxial growth method, as shown in FIG. 6. The thickness A of the n type layer 110 is equal to total thickness of the n type upper silicon region 110 and the p type body region 112. A p type impurity is added, for instance with ion implantation, to a predetermined region inside the n type layer 110. The predetermined region is a central portion of a region disposed over the p type silicon region 108. As a result, a p type connecting region 115 is formed, and an n type upper silicon region 110 that is partitioned by the p type connecting region 115 is simultaneously formed as shown in FIG. 7. Also as shown in FIG. 7, a p type impurity is furthermore added, for instance with ion implantation, into an overall upper region of the n type layer 110, so that a p type layer 112 is formed for constituting a p type body region. In the above ion plantation, velocity or amount of the ion plantation is controlled for attaining thickness B of the n type upper silicon region 110 and thickness C of the p type connecting region 115.

Figure 8:
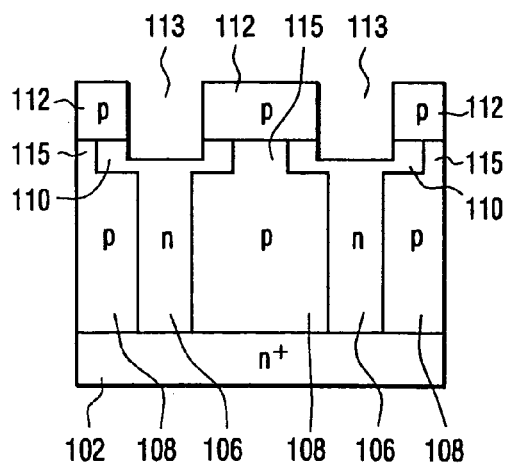
FIG. 8 is a view explaining part (7) of the first manufacturing method of the semiconductor device according to the first embodiment.

As shown in FIG. 8, a gate trench 113 is formed for penetrating the p type layer 112 to reach the n type upper silicon region 110, for instance with the anisotropic etching (RIE or the like) through masking, by the resist, over a central region of the n type upper silicon region 110.

Figure 9:
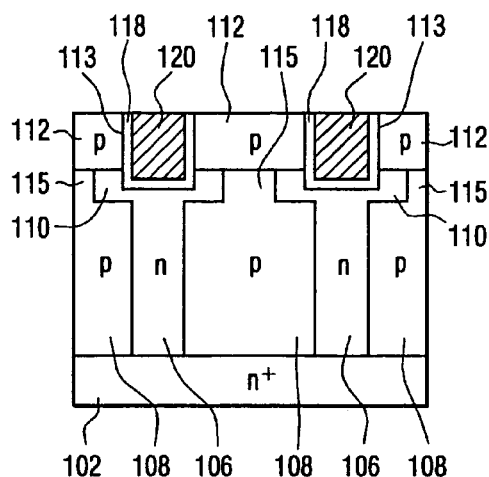
FIG. 9 is a view explaining part (8) of the first manufacturing method of the semiconductor device according to the first embodiment.

As shown in FIG. 9, a thin gate insulation film 118 of U-shaped silicon oxide film is then deposited along side walls and a bottom of the gate trench 113, for instance with chemical vapor deposition (CVD) method. Thereafter a gate electrode 120 of poly-silicon is deposited in the U-shaped gate insulation film 118 inside the gate trench 113, for instance with the CVD method. Finally, as shown in FIG. 1, an n⁺ type source region 114 is formed on the surface of the body region 112 with the ion plantation, e.g., using arsenic or phosphorus. A p⁺ type body contact region 116 is formed on the surface of the body region 112 with the ion plantation, e.g., using boron.

Through the above manufacturing steps, the vertical semiconductor device 100 of the first embodiment is manufactured.

In the above first manufacturing method instance, the trench 106a, the gate trench 113 or the like is formed with the anisotropic etching (RIE or the like). However, other types of a dry etching method and a wet etching method can be adopted. Although the p type layer 108 is planarized with the CMP, it can be planarized with an etch back or the like.

Although addition of the impurity is done with the ion plantation, a thermal diffusion method or the like can be adopted. Although the gate insulation film 118 is formed of the silicon oxide, it can be formed of high dielectric insulation film such as silicon nitride film, $SrTiO_3$ (STO) film, or $BaSrTiO_3$ (BST) film. The gate insulation film 118 is deposited inside the gate trench 113 with the CVD. However, it can be formed through thermal treatment using thermal oxidation applied to the side walls (body region 112) and the bottom (upper silicon region 110) of the gate trench 113. Although the gate electrode 120 is formed of the polysilicon, it can be formed of amorphous silicon layer, monocrystal silicon layer, or the like. These modifications can be also directed to other manufacturing method instances to be explained later.

In the first manufacturing method instance, as shown in FIG. 8, the gate trench 113 is formed, with the anisotropic etching or the like, inside the n type upper silicon region 110 that is previously formed as shown in FIG. 7. The ON resistance is thereby prevented from increasing due to the horizontal misalignment of masking and vertical misalignment of depth control during forming the gate trench 113.

Namely, as long as horizontal misalignment is within the width of the n type upper silicon region 110 shown in FIG. 8, the n type channel is hardly formed in the p type silicon region 108 during the ON state. Even if the misalignment exceeds the one end of the width of the n type upper silicon region 110, the n type channel is much less formed in the p type silicon region 108 in comparison with a semiconductor device having no n type upper silicon region 110.

Similarly, as long as vertical misalignment is within the depth (thickness) of the n type upper silicon region 110 shown in FIG. 8, the n type channel is hardly formed in the p type silicon region 108 during the ON state. Even if the misalignment exceeds the one end of the depth of the n type upper silicon region 110, the n type channel is much less formed in the p type silicon region 108 in comparison with the semiconductor device having no n type upper silicon region 110.

(Second Manufacturing Method Instance)

Figure 10:
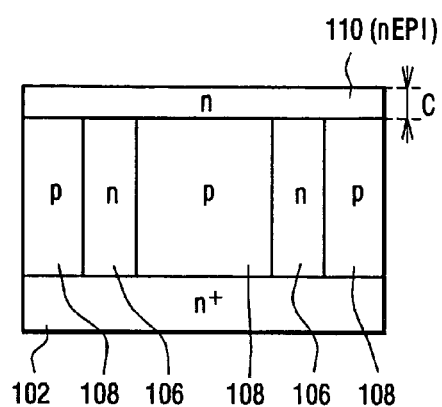
FIG. 10 is a view explaining part (1) of a second manufacturing method of the semiconductor device according to the first embodiment.

In a second manufacturing method instance, the steps shown in FIGS. 2 to 5 in the first manufacturing method instance are similarly operated. As shown in FIG. 10, an n type layer 110 having thickness C is then deposited using the epitaxial growth or the like. The thickness C is only for the n type upper silicon region 110, while the thickness A shown in FIG. 5 of the first manufacturing method instance is for not only the n type silicon region 110 but also the p type body region 112.

Figure 11:
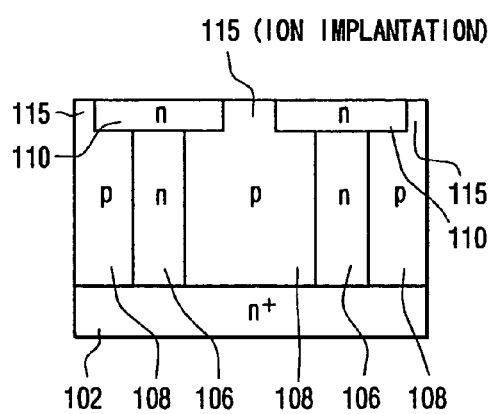
FIG. 11 is a view explaining part (2) of the second manufacturing method of the semiconductor device according to the first embodiment.

As shown in FIG. 11, a p type impurity is added into the n type layer 110 over a central region of the width of the p type silicon region 108 with the ion plantation or the like. The p type connecting region 115 is thereby formed and the n type silicon region 110 partitioned by the p type connecting region 115 is simultaneously formed.

Figure 12:
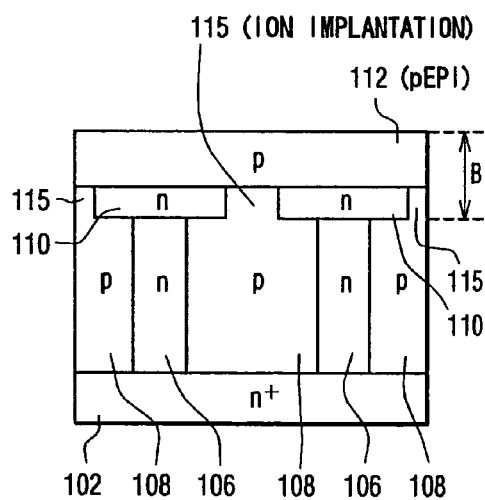
FIG. 12 is a view explaining part (3) of the second manufacturing method of the semiconductor device according to the first embodiment.

As shown in FIG. 12, a p type layer 112 having thickness B is then deposited over the p type connecting region 115 and the n type silicon region 110 with the epitaxial growth or the like. Subsequent steps are similar to that of the steps shown in FIGS. 8 and 9 of the first manufacturing method instance.

In this manufacturing method instance, as shown in FIG. 11, the p type impurity is added to the n type layer 110. However, without adding the p type impurity, a trench is once formed over the central region of the width of the p type silicon region 108 and the p type layer can be thereafter deposited inside the trench and on the n type silicon region 110.

Furthermore, in this manufacturing method instance, the n type layer 110 having thickness C is deposited, and then the p type impurity is added for forming the p type connecting region 115 and the n type upper silicon region 110.

However, instead of forming the n type layer, a p type layer having thickness C can be formed firstly. An n type impurity is then added, with the ion plantation or the like, to a predetermined region of the deposited p type layer over the n type drift region 106. The predetermined region has wider than the drift region 106. The n type upper silicon region 110 is thereby formed and the p type connecting region 115 partitioned by the n type upper silicon region 110 is simultaneously formed.

(Third Manufacturing Method Instance)

Figure 13:
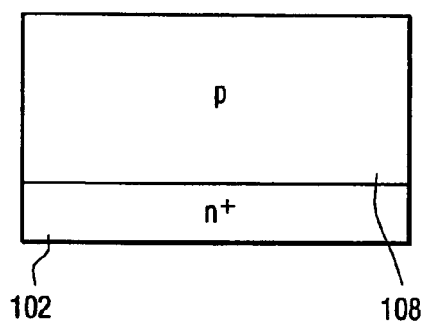
FIG. 13 is a view explaining part (1) of a third manufacturing method of the semiconductor device according to the first embodiment.

In a third manufacturing method instance, as shown in FIG. 13, a p type layer 108 is formed over an n+ type substrate (n+ type drain region) 102 with the epitaxial growth or the like.

Figure 14:
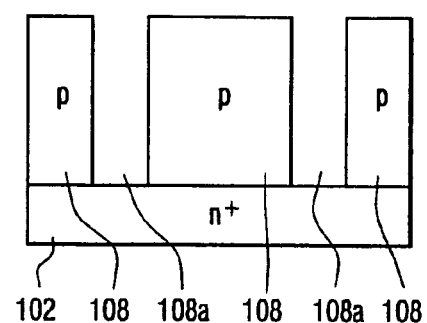
FIG. 14 is a view explaining part (2) of the third manufacturing method of the semiconductor device according to the first embodiment.

As shown in FIG. 14, a trench 108a is formed for penetrating the p type layer 108 to reach the n+ type drain region 102 through masking of the resist with the anisotropic etching (RIE or the like) or the like. The p type layer 108 becomes the p type silicon region 108.

Figure 15:
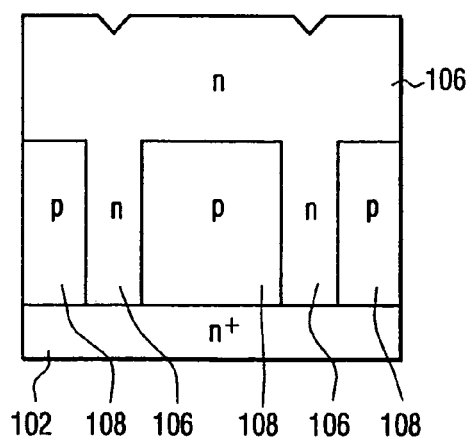
FIG. 15 is a view explaining part (3) of the third manufacturing method of the semiconductor device according to the first embodiment.

As shown in FIG. 15, with the epitaxial growth or the like, an n type layer 106 is then deposited inside the trench 108a to form alternate layers of the n type layer 106 and the p type layer 108 and consecutively an overhead n type layer 106 over the alternate layers.

Figure 16:
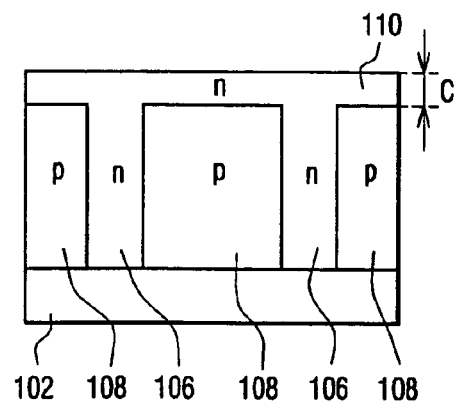
FIG. 16 is a view explaining part (4) of the third manufacturing method of the semiconductor device according to the first embodiment.

As shown in FIG. 16, the n type layer 110 is planarized with the CMP or the like till the n type layer 110 still has thickness C over the alternate layers. Thereafter, the steps shown in FIGS. 11 and 12 of the second manufacturing method instance are used and then the steps shown in FIGS. 8 and 9 of the first manufacturing method instance are used.

(Fourth Manufacturing Method Instance)

In a fourth manufacturing method instance, the steps shown in FIGS. 2 to 5 of the first manufacturing method instance are similarly used. However, in this manufacturing method instance, super-junction structure of the p type layer 108 and the n type layer 106 is formed for being thicker by thickness C than that of FIG. 5.

Figure 17:
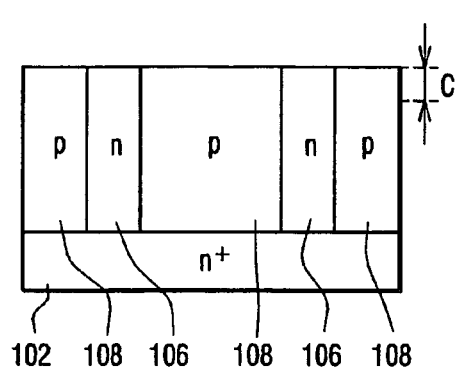
FIG. 17 is a view explaining part (1) of a fourth manufacturing method of the semiconductor device according to the first embodiment.
Figure 18:
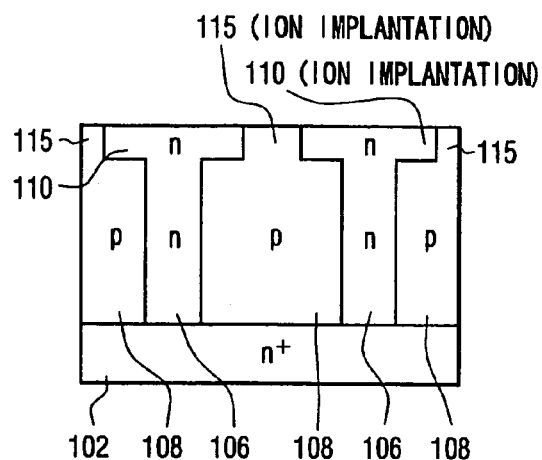
FIG. 18 is a view explaining part (2) of the fourth manufacturing method of the semiconductor device according to the first embodiment.

As shown in FIG. 18, an n type impurity is added with the ion implantation or the like to a region corresponding to thickness C of FIG. 17. Here, a p type impurity is then added to a region of the n type impurity implanted layer over a central region of the p type layer 108. A p type connecting region 115 is thereby formed, and an n type upper silicon region 110 partitioned by the p type connecting region 115 is simultaneously formed. Subsequent steps are similar to the steps shown in FIG. 12 of the second manufacturing method instance and the steps shown in FIGS. 8 and 9 of the first manufacturing method instance.

(Fifth Manufacturing Method Instance)

Figure 2:
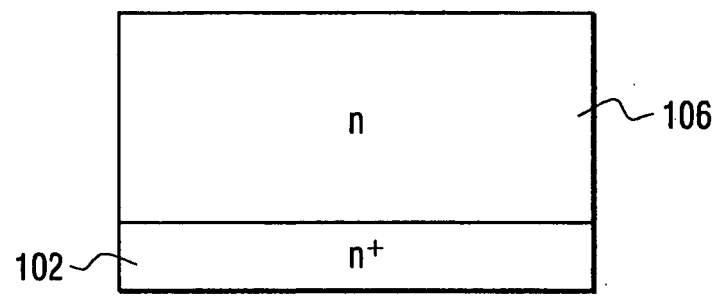
FIG. 2 is a view explaining part (1) of a first manufacturing method of the semiconductor device according to the first embodiment.
Figure 3:
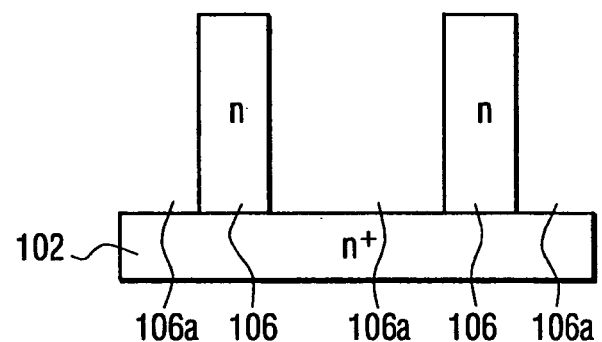
FIG. 3 is a view explaining part (2) of the first manufacturing method of the semiconductor device according to the first embodiment.

In a fifth manufacturing method instance, the steps shown in FIGS. 2 to 4 of the first manufacturing method instance are similarly used. However, in this manufacturing method instance, as shown in FIG. 19, a p type layer having thickness C is left over the super-junction structure of the p type layer 108 and the n type layer 106 through planarization with the CMP or the like.

Figure 19:
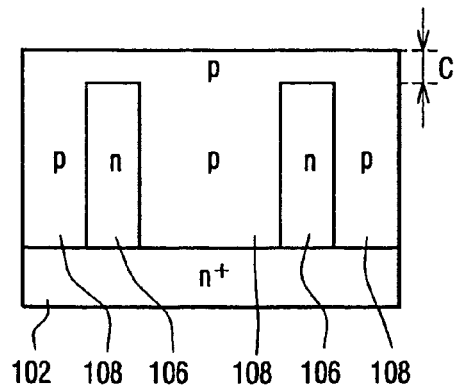
FIG. 19 is a view explaining part (1) of a fifth manufacturing method of the semiconductor device according to the first embodiment.
Figure 20:
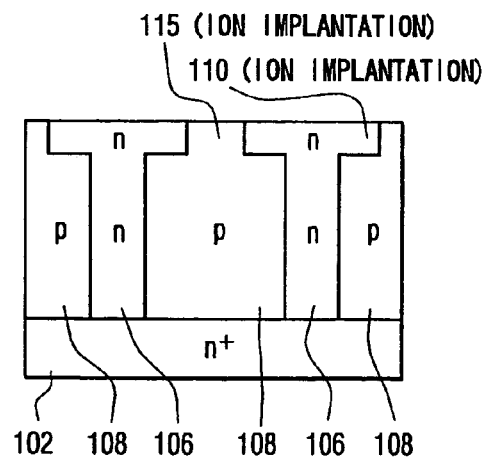
FIG. 20 is a view explaining part (2) of the fifth manufacturing method of the semiconductor device according to the first embodiment.

As shown in FIG. 20, an n type impurity is added with the ion implantation or the like to a region corresponding to thickness C of FIG. 19. Here, a p type impurity is then added to a region of the n type impurity implanted layer over a central region of the p type layer 108. A p type connecting region 115 is thereby formed. Subsequent steps are similar to the steps shown in FIG. 12 of the second manufacturing method instance and the steps shown in FIGS. 8 and 9 of the first manufacturing method instance.

(Sixth Manufacturing Method Instance)

Figure 21:
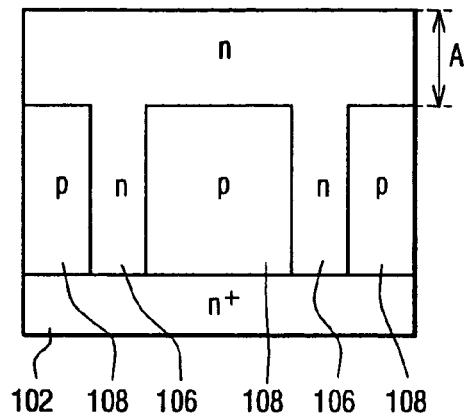
FIG. 21 is a view explaining part of a sixth manufacturing method of the semiconductor device according to the first embodiment.

In a sixth manufacturing method instance, the steps shown in FIGS. 13 to 15 of the third manufacturing method instance are similarly used. As shown in FIG. 21, an n type layer having thickness A is then left over the super-junction structure of the p type layer 108 and the n type layer 106 through planarization with the CMP or the like. In the third manufacturing method instance, as shown in FIG. 16, the n type layer having thickness C instead of thickness A is left over the super-junction structure.

Subsequent steps are similar to the steps shown in FIGS. 7 to 9 of the first manufacturing method instance.

(Seventh Manufacturing Method Instance)

Figure 22:
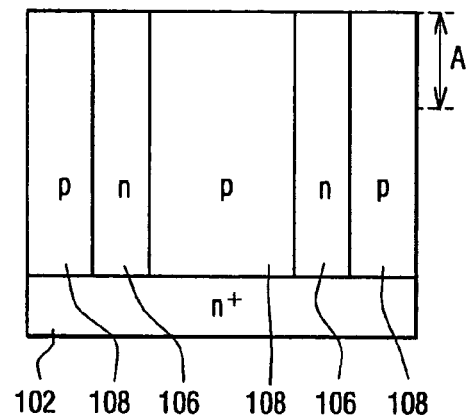
FIG. 22 is a view explaining part (1) of a seventh manufacturing method of the semiconductor device according to the first embodiment.

In a seventh manufacturing method instance, the steps shown in FIGS. 2 to 4 of the first manufacturing method instance are similarly used. However, in this manufacturing method instance, super-junction structure of the p type layer 108 and the n type layer 106 is formed, as shown in FIG. 22, for being thicker by thickness A than that of FIG. 5. In addition to this, in the fourth manufacturing method instance, the super-junction structure is formed for being thicker by thickness C instead of A than that of FIG. 5, as shown in FIG. 17.

Figure 23:
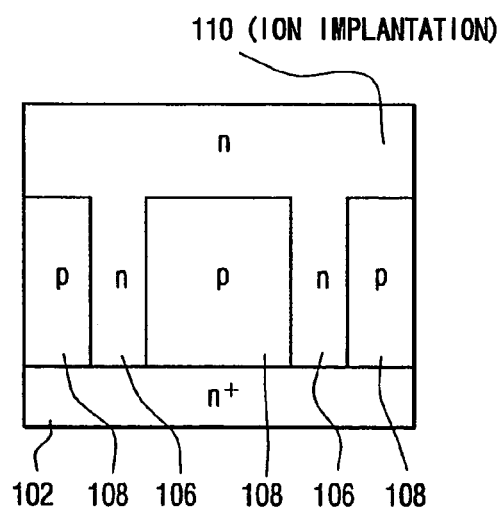
FIG. 23 is a view explaining part (2) of the seventh manufacturing method of the semiconductor device according to the first embodiment.

As shown in FIG. 23, an n type impurity is added with the ion implantation or the like to a region corresponding to thickness A of FIG. 22. Subsequent steps are similar to the steps shown in FIGS. 7 to 9 of the first manufacturing method instance.

(Eighth Manufacturing Method Instance)

Figure 24:
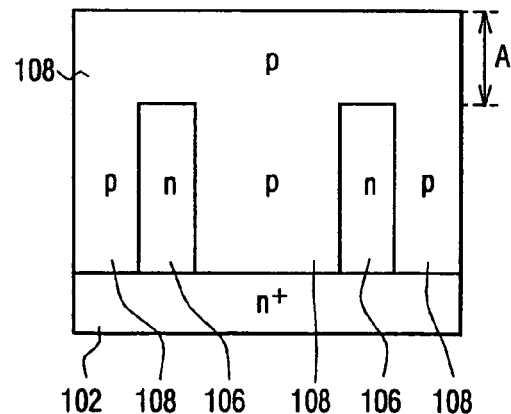
FIG. 24 is a view explaining part (1) of an eighth manufacturing method of the semiconductor device according to the first embodiment.

In an eighth manufacturing method instance, the steps shown in FIGS. 2 to 4 of the first manufacturing method instance are similarly used. However, in this manufacturing method instance, a p type layer having thickness A is formed over the super-junction structure of the p type layer 108 and the n type layer 106 through planarization with the CMP or the like, as shown in FIG. 24. Incidentally, in the fifth manufacturing method instance, the p type layer having thickness C instead of A is left over the super-junction structure as shown in FIG. 19.

Figure 25:
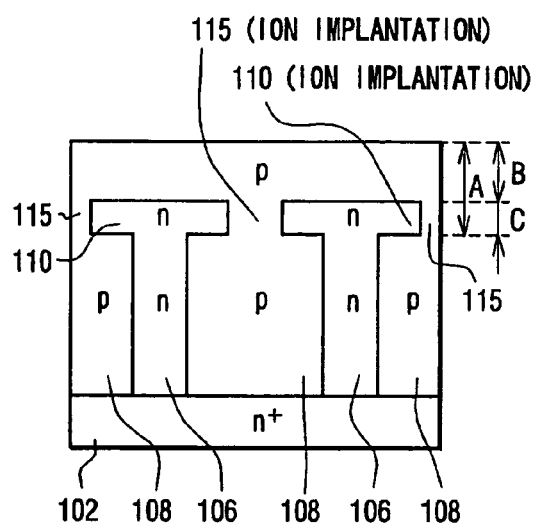
FIG. 25 is a view explaining part (2) of the eighth manufacturing method of the semiconductor device according to the first embodiment.

As shown in FIG. 25, the ion implantation is repeatedly executed for forming an n type upper silicon region 110, a p type connecting region 115, and a p type layer 112. In detail, for instance, an n type impurity is once added with the ion plantation to an overall region corresponding to thickness A in FIG. 25. Thereafter, a p type impurity is added with the ion plantation to a predetermined region corresponding to thickness C over a central region of the p type layer 108. A p type connecting region 115 is thereby formed. Furthermore, a p type impurity is added with the ion plantation to an overall region corresponding to thickness B. Subsequent steps are similar to the steps shown in FIGS. 8 and 9 of the first manufacturing method instance.

Here, steps of the ion plantation are not limited to the above steps. An n type impurity can be, from the first step, added to a region corresponding to 110 in FIG. 25.

(Ninth Manufacturing Method Instance)

Figure 26:
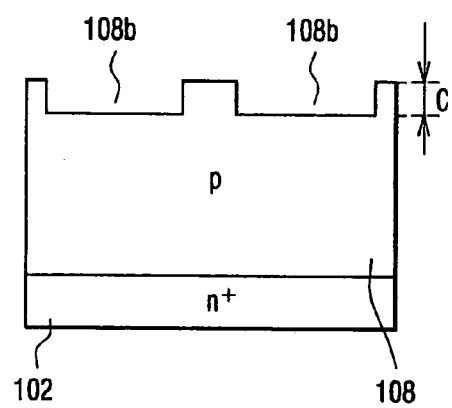
FIG. 26 is a view explaining part (1) of a ninth manufacturing method of the semiconductor device according to the first embodiment.
Figure 27:
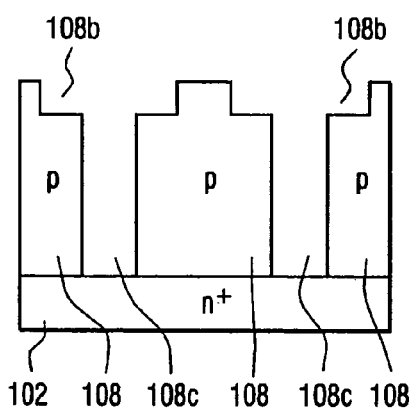
FIG. 27 is a view explaining part (2) of the ninth manufacturing method of the semiconductor device according to the first embodiment.

In a ninth manufacturing method instance, as shown in FIG. 26, a p type layer 108 is deposited with the epitaxial growth or the like over an $n^+$ type substrate ($n^+$ type drain region) 102. A first trench 108b is formed in a region corresponding to thickness C in FIG. 26 through masking of the resist with the anisotropic etching (RIE or the like) or the like. As shown in FIG. 27, a second trench 108c having a narrower width than the first trench 108b is downwardly formed from a bottom of the first trench 108b. It is also formed for penetrating the p type layer 108 to reach the $n^+$ type drain region 102 through masking of the resist with the anisotropic etching (RIE or the like) or the like.

Figure 28:
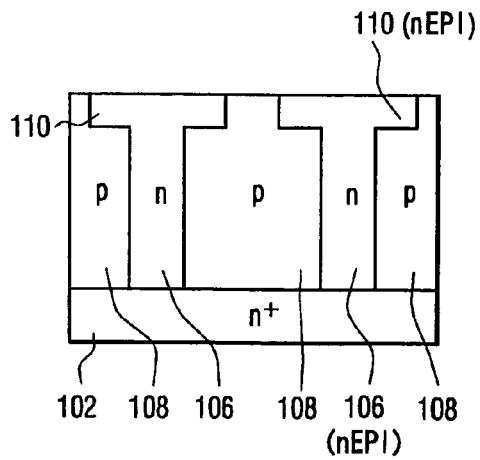
FIG. 28 is a view explaining part (3) of the ninth manufacturing method of the semiconductor device according to the first embodiment.

As shown in FIG. 28, an n type layer 106 is deposited in the second trench 108c and then in the first trench 108b. Thereafter, the steps shown in FIG. 12 of the second manufacturing method instance is used and then the steps shown in FIGS. 8 and 9 of the first manufacturing method instance are used.

In the above manufacturing method instances, concentration of the impurity can be the same or different between the n type drift region 106 and the n type upper silicon region 110. In particular, impurity concentration of the n type upper silicon region 110 can be attained to be lower than that of the drift region 106 without any additional manufacturing steps in a case where the n type drift region 106 and the n type upper silicon region 110 are not deposited consecutively. The case corresponds to the followings: the first manufacturing method instance shown in FIG. 6; the second manufacturing method instance shown in FIG. 10; the fourth manufacturing method instance shown in FIG. 18; the fifth manufacturing method instance shown in FIG. 20; the seventh manufacturing method instance shown in FIG. 23; and the eighth manufacturing method instance shown in FIG. 25.

Second Embodiment

Figure 29:
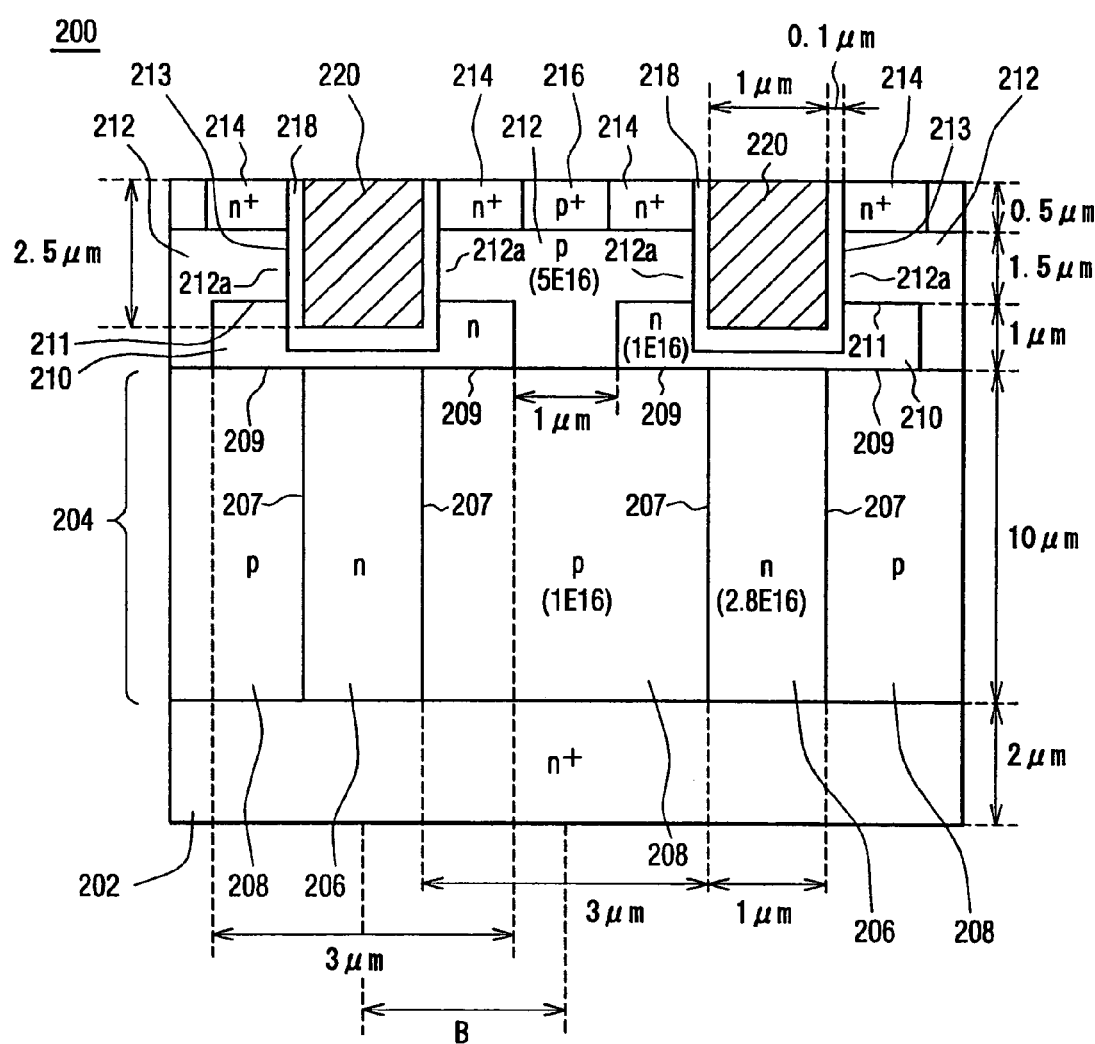
FIG. 29 is a sectional view of a semiconductor device according to a second embodiment.

A vertical semiconductor device 200 as a second embodiment is shown in a sectional view in FIG. 29. The vertical semiconductor device 200 includes an $n^-$ type upper silicon region 210 independently from an n type drift region 206. The $n^-$ type upper silicon region 210 has an n type impurity of $1\ E\ 16\ cm^{-3}$, while the n type drift region 206 has an n type impurity of $2.8\ E\ 16\ cm^{-3}$. It is thus favorable that the $n^-$ type upper silicon region 210 has lower impurity concentration than the n type drift region 206. With an object that the $n^-$ type upper silicon region 210 should be occupied with the depletion layer during withstanding voltage, it is favorable that the $n^-$ type upper silicon region 210 has lower impurity concentration. By contrast, the n type drift region 206 is required to have low ON resistance in addition of high withstanding voltage, so that it favorably has high impurity concentration. The $n^-$ type upper silicon region 210 is assembled inside the p type body region 212. These are main different features from the first embodiment. Further, pn junctions 207, 209, 211 are shown in FIG. 29.

Figure 30:
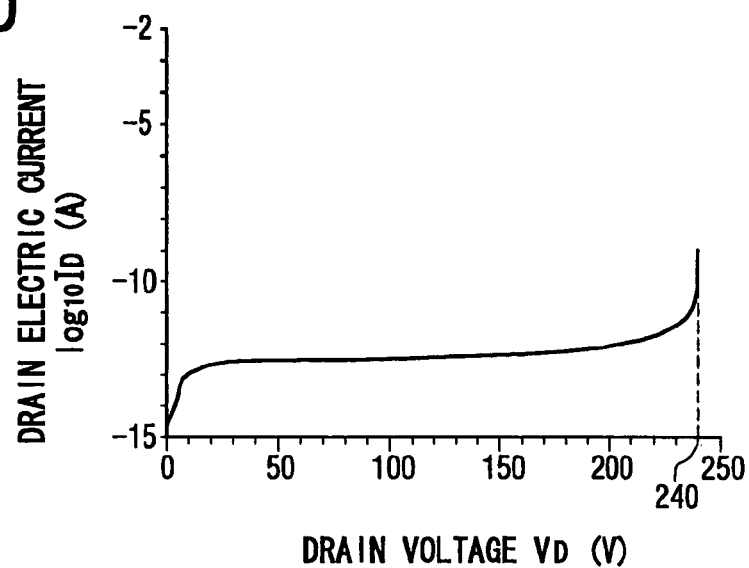
FIG. 30 is a diagram showing a characteristic of withstanding voltage of the semiconductor device according to the second embodiment.

Simulation result of a characteristic of the vertical semiconductor device 200 will be explained below. A characteristic of drain voltage $V_D$ and drain electric current $I_D$ (withstanding-voltage characteristic) of the semiconductor device 200 is shown in FIG. 30. The drain voltage $V_D$ is increased every 0.2 V in a range from 0 to 250 V. Here, gate voltage, source voltage, and body voltage are set to 0 V. At about 240 V of the drain voltage $V_D$, the semiconductor device 200 is broken down. This means that break-down voltage is about 240 V.

Figure 31:
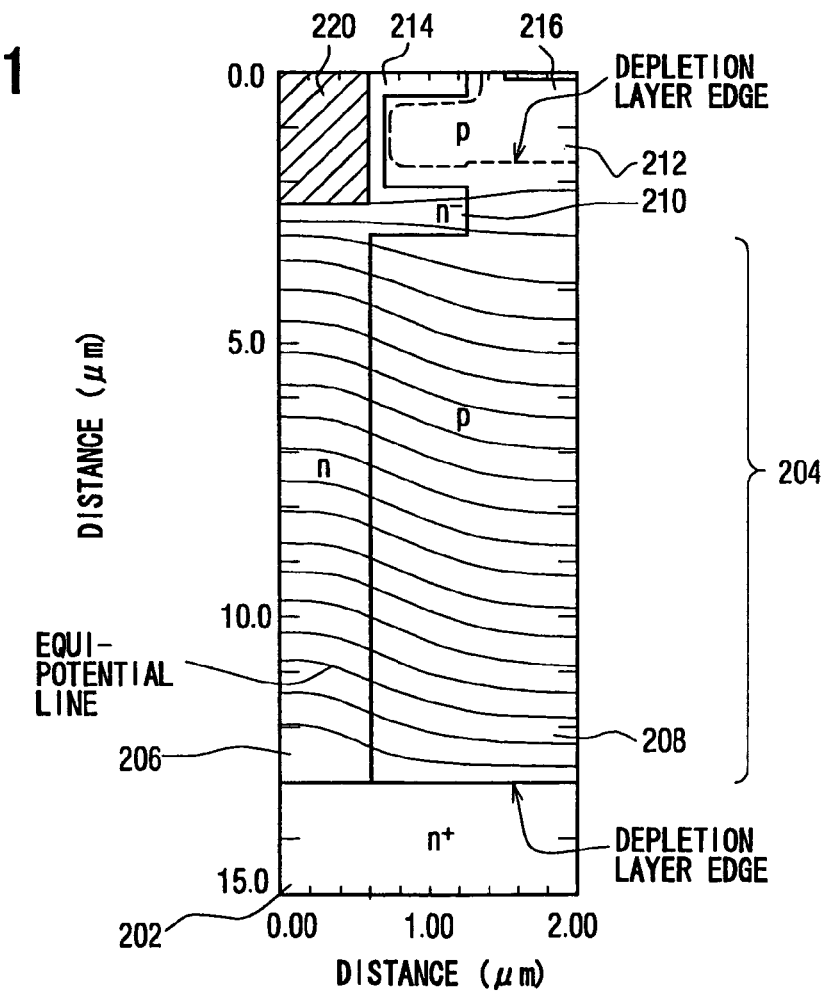
FIG. 31 is a diagram showing voltage distribution at drain voltage of 200 V of the semiconductor device according to the second embodiment.

Voltage distribution of the semiconductor device 200 is shown at 200 V of the drain voltage $V_D$ in FIG. 31. FIG. 31 shows a half cell of the semiconductor device 200 corresponding to width B region in FIG. 29 with depletion layer edges. It is shown that the n type drift region 206, p type silicon region 208, and $n^-$ type silicon region 210 are thoroughly occupied with the depletion layers. Electric potential contour lines are distributed at almost even intervals.

Figure 32:
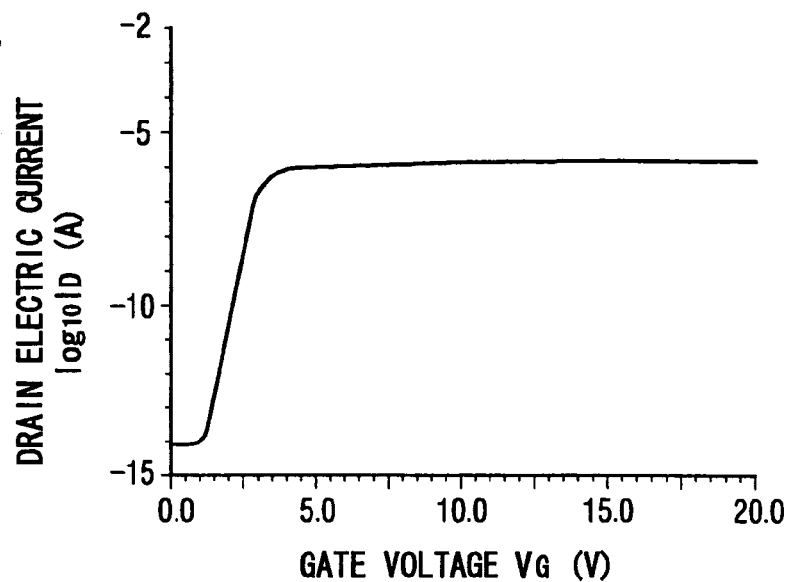
FIG. 32 is a diagram showing ON characteristic of the semiconductor device according to the second embodiment.

A characteristic of gate voltage $V_G$ and drain electric current $I_D$ (ON characteristic) of the semiconductor device 200 is shown in FIG. 32. The gate voltage $V_G$ is increased every 0.05 V in a range from 0 to 20 V. Here, the drain voltage $V_D$ is set to 0.1 V. The source voltage and the body voltage are set to 0 V. From FIG. 32, at $V_G$=15 V the ON resistance ($R_{ON}$) of the semiconductor device 200 is calculated to be about 0.17 Ω mm².

Figure 33:
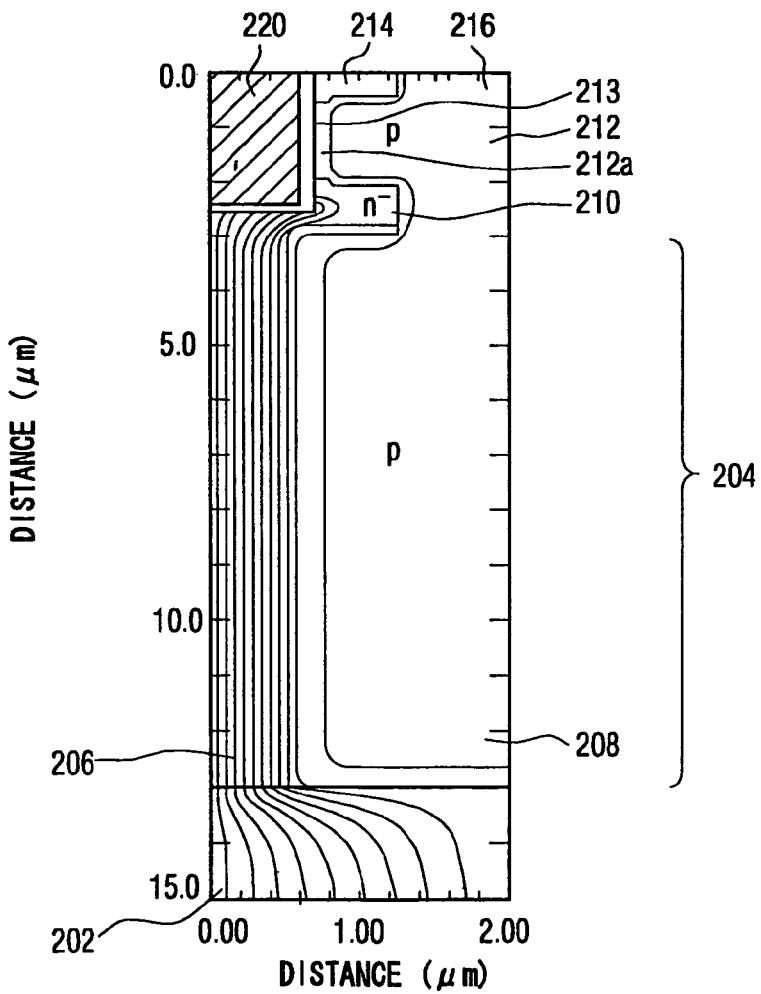
FIG. 33 is a diagram showing electric current distribution at gate voltage of 15 V of the semiconductor device a according to the second embodiment.

Electric current flow of the semiconductor device 200 is shown at 15 V of the gate voltage $V_G$ in FIG. 33. FIG. 33 also shows the half cell of the semiconductor device 200 corresponding to width B region in FIG. 29. It is shown that a channel is formed not in a p type silicon region 208, but only in a region 212a inside a p type body region 212 close to a side wall of a gate trench 213.

Figure 34:
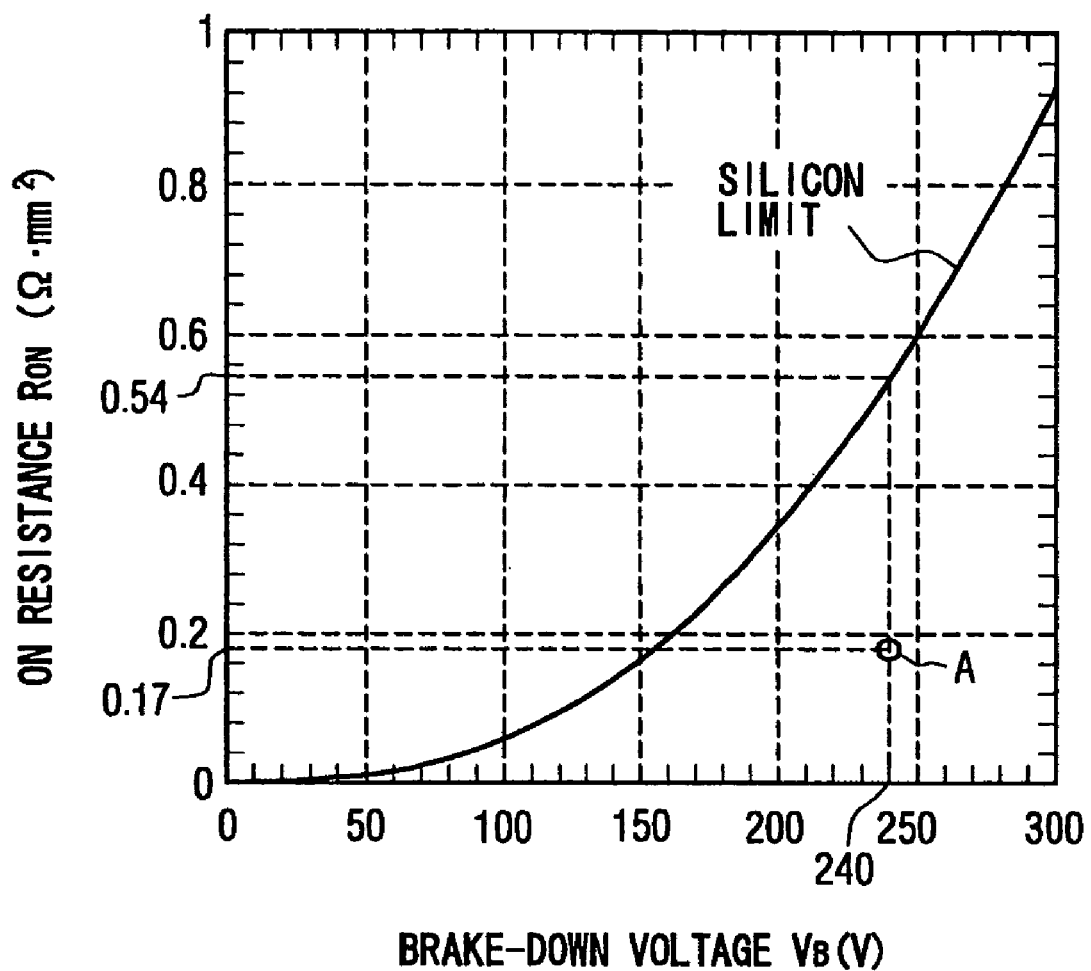
FIG. 34 is a diagram showing characteristic of brakedown voltage and ON resistance of the semiconductor device according to the second embodiment.

A characteristic of break-down voltage $V_B$ and ON resistance $R_{ON}$ of the semiconductor device 200 is shown in FIG. 34. A curve shown in FIG. 34 shows a silicon limit. The silicon limit is a minimum value of the ON resistance uniquely determined by withstanding voltage as described in "POWER MOSFETS Theory and Applications" (author: D. A. Grant, publisher: John Wiley & Sons). It is shown that the ON resistance $R_{ON}$ is increased with increasing break-down voltage $V_B$.

Point A in FIG. 34 is plotted based on break-down voltage $V_B$ (about 240 V) and ON resistance $R_{ON}$ (about 0.17 Ω mm²) derived from FIGS. 30 and 32. In the silicon limit, at brake-down voltage $V_B$=240 V, ON resistance $R_{ON}$ measures about 0.54 Ω mm². Namely, the ON resistance $R_{ON}$ of the semiconductor device 200 is less than one third of the ON resistance along the silicon limit curve. The structure of the semiconductor device 200 of the second embodiment provides a semiconductor device simultaneously having high withstanding voltage and low ON resistance. This performance is superior to that corresponding to the silicon limit.

Third Embodiment

Figure 35:
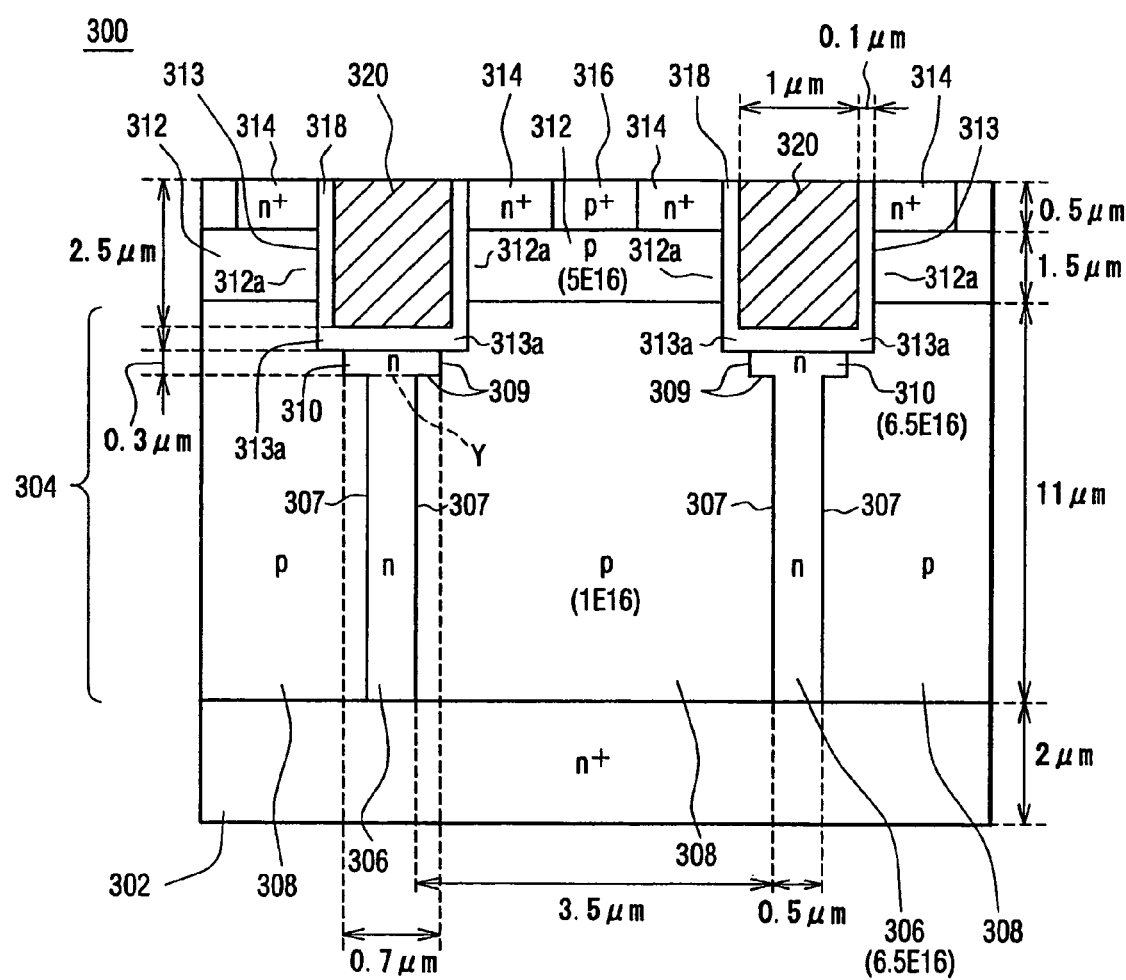
FIG. 35 is a sectional view of a semiconductor device according to a third embodiment.

A vertical semiconductor device 300 as a third embodiment is shown in a sectional view in FIG. 35. In the vertical semiconductor device 300, width (0.5 μm) of an n type drift region 306 is narrower than width (1 μm) of the n type drift region 106 of the first embodiment shown in FIG. 1. The n type drift region 306 has an n type impurity of 6.5 E 16 cm³. Width (3.5 μm) of a p type silicon region 308 is broader than width (3 μm) of the p type silicon region 108 of the first embodiment. The p type silicon region 308 has a p type impurity of 1.0 E 16 cm⁻³. Width (0.7 μm) of an n type upper silicon region 310 is narrower than width (3 μm) of the n type upper silicon region 110 of the first embodiment. Here, the n type upper silicon region 310 and the n type drift region 308 are formed as one uniform body with having a boundary at dotted line Y in FIG. 35.

Width (0.7 μm) of the n type upper silicon region 310 is narrower than that (1.2 μm) of a gate trench 313. The n type upper silicon region 310 connects with the n type drift region 306, while it does not connect with a p type body region 312. Thickness (0.3 μm) of the n type upper silicon region 310 is thinner than that (1 μm) of the n type upper silicon region 110 of the first embodiment. The n type upper silicon region 310 is disposed only under a bottom of the gate trench 313, while the n type upper silicon region 110 of the first embodiment surrounds the lower side walls and bottom of the gate trench 113. The n type upper silicon region 310 has an n type impurity of 6.5 E 16 cm⁻³. These are different features from the first embodiment. Further, pn junctions 307, 309 are shown in FIG. 35.

In the vertical semiconductor device 300 of the third embodiment, the n type upper silicon region 310 has narrow width and thin thickness. When horizontal misalignment of masking or vertical misalignment of depth control is small, the ON resistance can be prevented from increasing by lessening a region where a channel is formed inside the p type silicon region.

Fourth Embodiment

Figure 36:
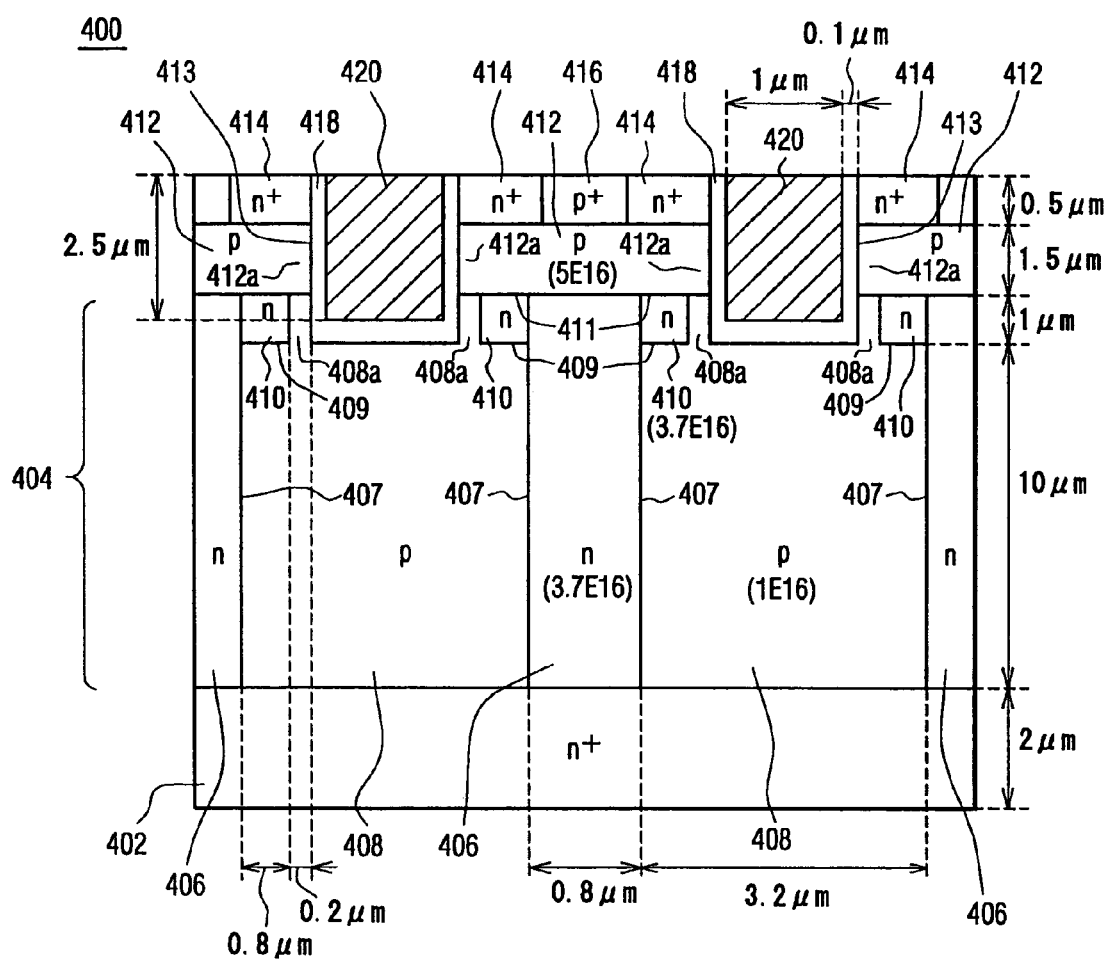
FIG. 36 is a sectional view of a semiconductor device according to a fourth embodiment.

A vertical semiconductor device 400 as a fourth embodiment is shown in a sectional view in FIG. 36. In the vertical semiconductor device 400, relationship between alternate layers of super-junction structure 404 and a gate electrode 420 (or gate trench 413) is different from that of the first embodiment. In detail, an n type drift region 406 is not disposed under the gate trench 413, but under a region that is located between the gate trenches 413. The n type drift region 406 has width of 0.8 μm and an n type impurity of 3.7 E 16 cm⁻³. Under the gate trench 413, a p type silicon region 408 is disposed. The p type silicon region 408 has width of 3.2 μm and a p type impurity of 1.0 E 16 cm⁻³.

An n type upper silicon region 410 is disposed near a lower side wall of the gate trench 413 in an uppermost portion of the p type silicon region 408. The n type upper silicon region 410 has width of 0.8 μm and thickness of 1 μm with an n type impurity of 3.7 E 16 cm⁻³. The n type upper silicon region 410 connects with a p type body region 412, but does not connect with the gate trench 413 (gate insulation film 418). The p type silicon region 408 has, between the gate trench 413 and the n type upper silicon region 410, a small portion 408a that is 0.2 μm wide and connects with the p type body region 412. Further, pn junctions 407, 409, 411 are shown in FIG. 36.

In the vertical semiconductor device 400 of the fourth embodiment, an electron inside the p type body region 412 congregates in a region 412a while the semiconductor device 400 is in an ON state. An n type channel is thereby formed in the region 412a similarly with the first embodiment. An electron supplied from an n⁺ type source region 414 flows through the n type channel 412a, the n type upper silicon region 410, and the n type drift region 406 to reach an n⁺ type drain region 402. Here, when the electron reaches the n type upper silicon region 410 from the n type channel 412a, it passes slightly through a region 408a inside the p type silicon region 408. An n type channel is thereby formed inside the p type silicon region 408. However, the formed n type channel is much lessened in comparison with that of a semiconductor device having no n⁻ type upper silicon region.

During withstanding voltage, depletion layers are broadened from pn junctions 407, 409 towards regions 406, 408, and 410. The regions 406, 408 are thereby completely occupied with the depletion layers, which phenomena leads to obtaining high withstanding voltage.

Fifth Embodiment

Figure 37:
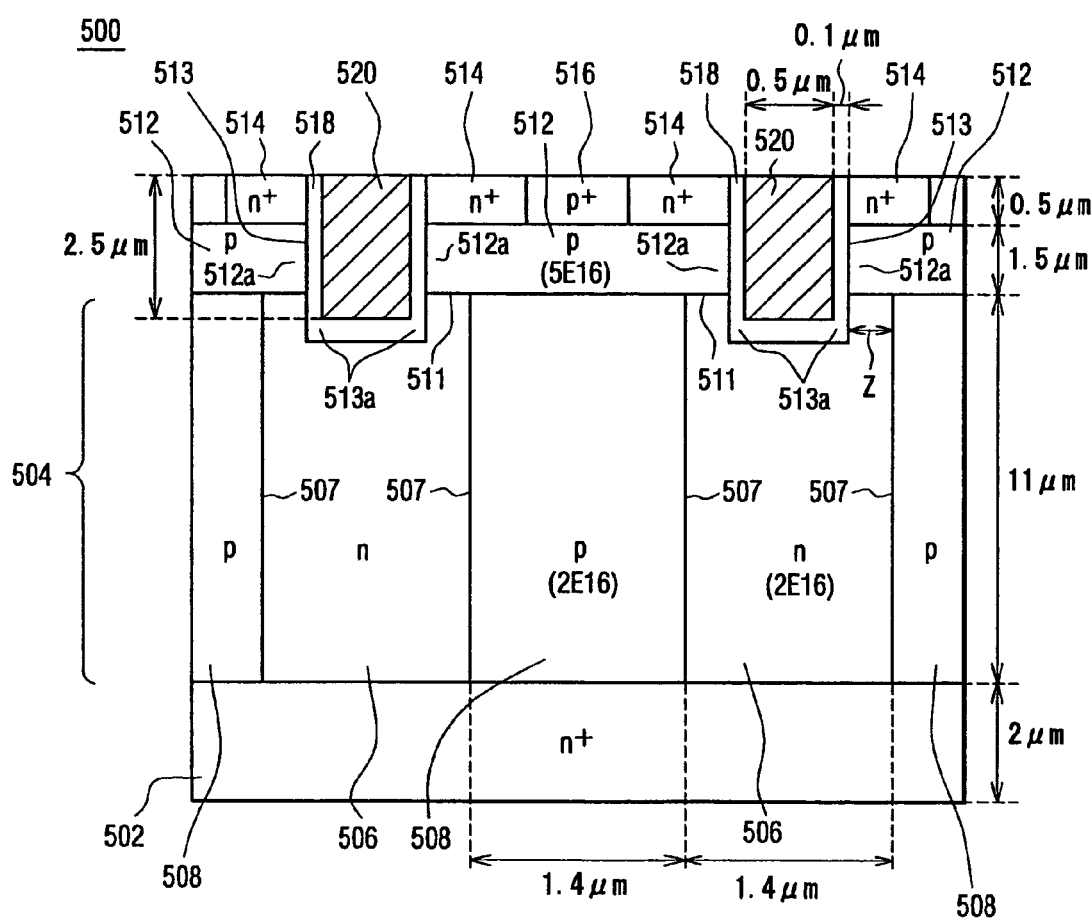
FIG. 37 is a sectional view of a semiconductor device according to a fifth embodiment.

A vertical semiconductor device 500 as a fifth embodiment is shown in a sectional view in FIG. 37. In the vertical semiconductor device 500, no upper silicon layer is provided, but an n type drift region 506 connects with a p type body region 512. The n type drift region 506 also connects with a region 512a where an n type channel is formed. A p type silicon region 508 connects with the p type body region 512. Width (1.4 μm) of the n type drift region 506 is broader than that (0.7 μm) of a gate trench 513 by almost same length in each of both ends of the width. The n type drift region 506 surrounds lower side walls 513a and a bottom of the gate trench 513. The n type drift region 506 has an n type impurity of 2.0 E 16 cm$^{-3}$. Width (1.4 μm) of the p type silicon region 508 is narrower than that (3.0 μm) of the p type silicon region 108 of the first embodiment. The p type silicon region 508 has an p type impurity of 2.0 E 16 cm$^{-3}$. These are different features from the first embodiment. Further, pn junctions 507, 509 are shown in FIG. 37.

Structure of the vertical semiconductor device 500 of the fifth embodiment prevents ON resistance due to masking or depth control misalignment from increasing even without the upper silicon region. Here, the p type silicon region 508 is not shifted into floating electric potential, so that a withstanding-voltage characteristic is maintained to be stable. Furthermore, an electric current passage is shortened between the p type silicon region 508 and the p type body region 512.

Here, width of the n type drift region 506 must be broader than that of the gate trench 513. It is difficult for the width of a trench to be less than 0.5 μm at present technology. Even if masking misalignment occurs, the bottom of the gate trench 513 must be thoroughly inside the n type drift region 506. Width z shown in FIG. 37 is therefore set to 0.35 μm. The n type drift region 506 thereby requires width of 1.4 μm.

Figure 38:
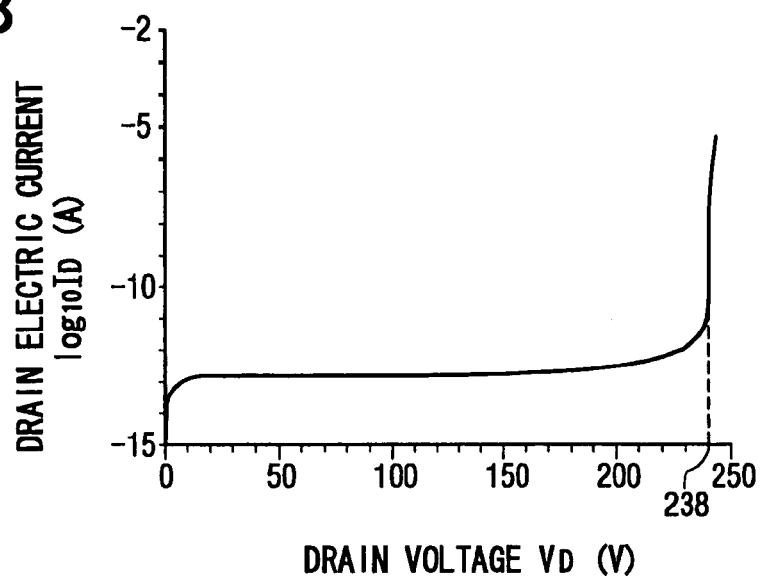
FIG. 38 is a diagram showing a characteristic of withstanding voltage of the semiconductor device according to the fifth embodiment.

Simulation result of a characteristic of the vertical semiconductor device 500 will be explained below. Here, the n type drift region 506 and the p type silicon region similarly have width of 1.4 μm and impurity concentration of 2 E 16 cm$^{-3}$. A characteristic of withstanding voltage is shown in FIG. 38. Here, conditions regarding drain voltage or the like are same as that of the second embodiment (FIG. 30). It is shown that break-down voltage is about 238 V.

Figure 39:
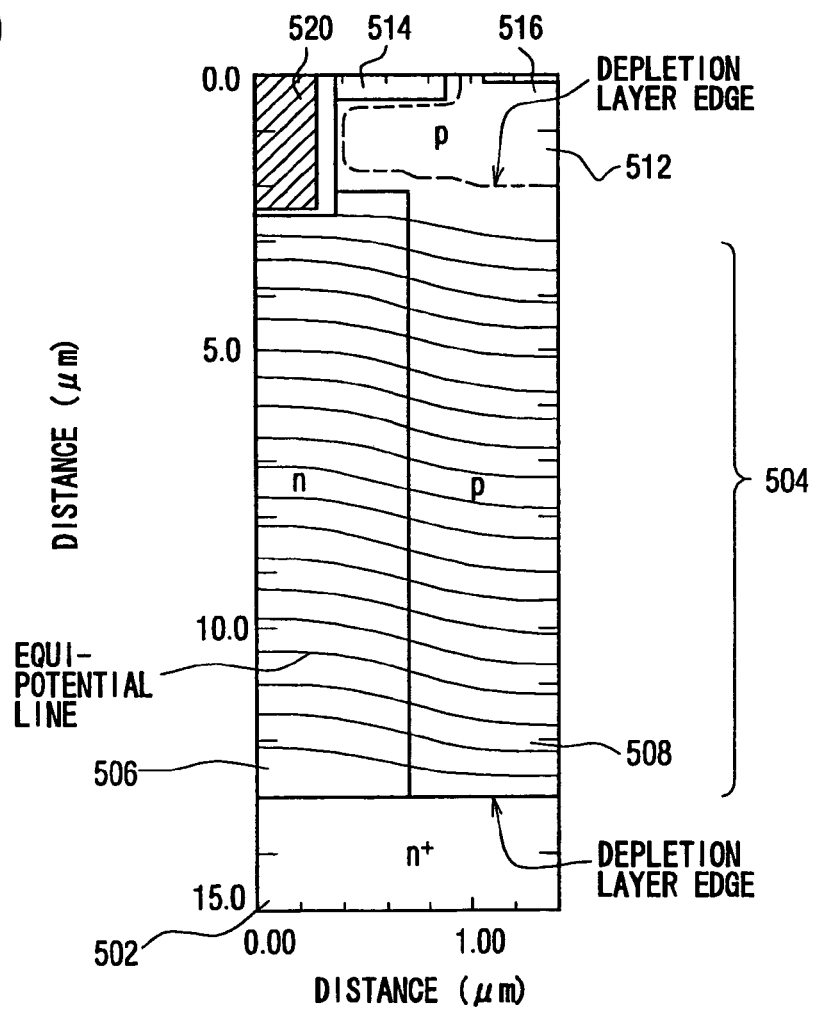
FIG. 39 is a diagram showing voltage distribution at drain voltage of 200 V of the semiconductor device according to the fifth embodiment.

Voltage distribution of the semiconductor device 500 is shown at 200 V of the drain voltage $V_D$ in FIG. 39. It is shown that the n type drift region 506 and p type silicon region 508 are thoroughly occupied with depletion layers. Electric potential contour lines are distributed at almost even intervals.

Figure 40:
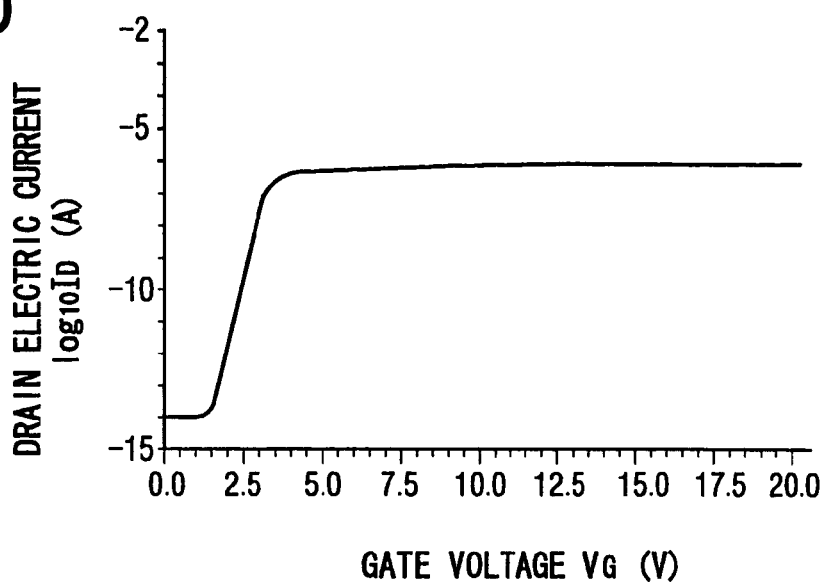
FIG. 40 is a diagram showing ON characteristic of the semiconductor device according to the fifth embodiment.

An ON characteristic of the semiconductor device 500 is shown in FIG. 40. Here, conditions regarding gate voltage or the like are same as that of the second embodiment (FIG. 32). From FIG. 40, at $V_G$=15 V the ON resistance ($R_{ON}$) of the semiconductor device 500 is calculated to be about 0.09 Ω mm$^2$. This performance of the fifth embodiment is also much superior to that corresponding to the silicon limit.

Figure 41:
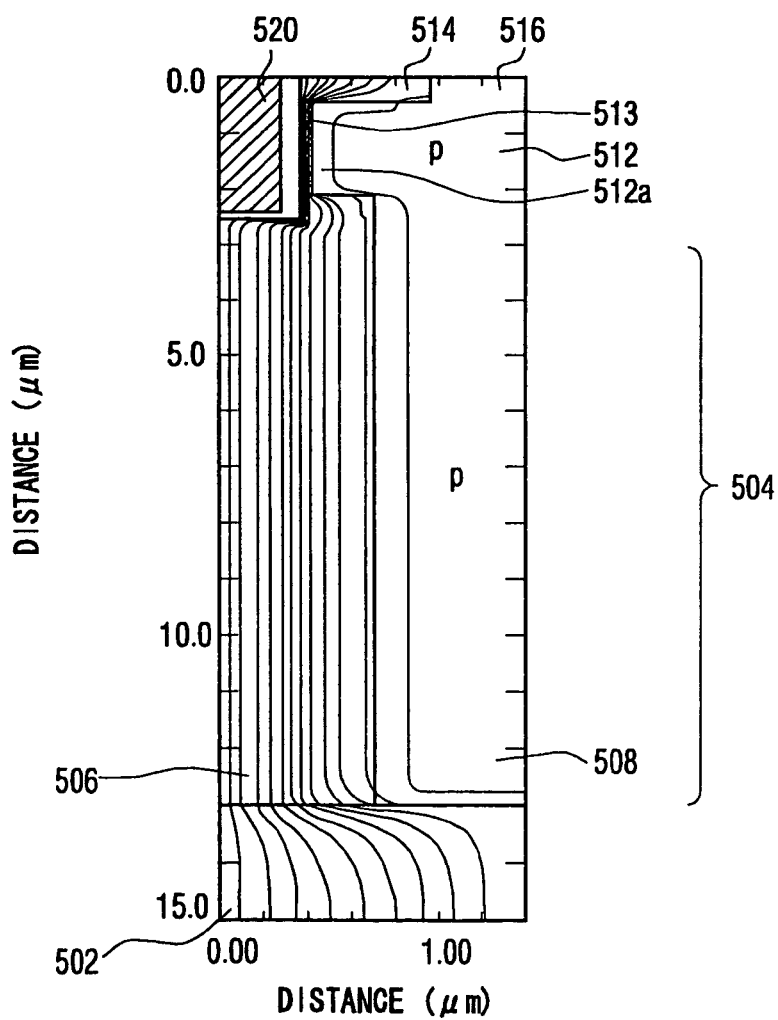
FIG. 41 is a diagram showing electric current distribution at gate voltage of 15 V of the semiconductor device according to the fifth embodiment.

Electric current flow of the semiconductor device 500 is shown at 15 V of the gate voltage $V_G$ in FIG. 41. It is shown that a channel is formed not in the p type silicon region 508, but only in a region 512a inside the p type body region 512 close to the side wall of the gate trench 513.

(Other Modifications)

The above embodiments are explained regarding the n type power MOS. However, the present invention can be directed to a p type power MOS. Furthermore, the present invention can be directed to not only the U-shaped MOS, but also V-shaped MOS, IGBT, MOS gate thyristor, or the like.

Although the first to ninth manufacturing method instances are explained regarding the first embodiment, similar manufacturing method instances are adopted for the second to fifth embodiments. Technologies included in the first to ninth manufacturing method instances are directed to the second to fifth embodiments.

What is claimed is:

1. A semiconductor device manufacturing method comprising the steps of:
    forming a drain region of a first conductivity type;
    forming, over a surface of the drain region, alternate layers of a drift region of the first conductivity type and a second semiconductor region of a second conductivity type, wherein the alternate layers are substantially orthogonal to the surface of the drain region;
    forming, over the drift region, a first semiconductor region of the first conductivity type, wherein the first semiconductor region is broader than the drift region in a direction parallel with the surface of the drain region;
    forming, over the second semiconductor region and the first semiconductor region, a body region of the second conductivity type;
    forming a gate trench that penetrates the body region and connects with the first semiconductor region; and
    filling a gate electrode in the gate trench,
    wherein, after the alternate layers of the drift region and the second semiconductor region are fo formed, an intermediate first semiconductor region of the first semiconductor type is formed,
    wherein a connecting region that is the second conductivity type and reaches the second semiconductor region is then formed as an extended portion of the second semiconductor region by adding a second conductivity type impurity to a portion of the intermediate first semiconductor region, and the first semiconductor region is farmed as a region excluding the connecting region from the intermediate first semiconductor region, and
    wherein the body region is formed for being deposited over the first semiconductor region and the second semiconductor region that includes the connecting region.

2. A semiconductor device manufacturing method according to claim 1,
    wherein the first semiconductor region is formed for being broader than the gate trench in the direction parallel with the surface of the drain region.

3. A semiconductor device manufacturing method according to claim 1,
    wherein the intermediate first semiconductor region is formed for being deposited over the alternate layers of the drift region and the second semiconductor region.

4. A semiconductor device manufacturing method according to claim 3,
    wherein, after the drain region is formed, an intermediate second semiconductor region of a second conductivity type is deposited over the drain region,
    wherein a given trench is formed for penetrating a portion of the intermediate second semiconductor region to reach the drain region,
    wherein the alternate layers of the drift region and the second semiconductor region are formed by depositing the drift region inside the given trench, and
    wherein the intermediate first semiconductor region is then consecutively formed for being deposited.

5. A semiconductor device manufacturing method according to claim 1,
    wherein, after the alternate layers of the drift region and the second semiconductor region are formed, the intermediate first semiconductor region is formed by adding a first conductivity type impurity to upper portions of the alternate layers.

6. A semiconductor device manufacturing method comprising the steps of:
forming a drain region of a first conductivity type;
forming, over a surface of the drain region, alternate layers of a drift region of the first conductivity type and a second semiconductor region of a second conductivity type, wherein the alternate layers are substantially orthogonal to the surface of the drain region;
forming, over the drift region, a first semiconductor region of the first conductivity type, wherein the first semiconductor region is broader than the drift region in a direction parallel with the surface of the drain region;
forming, over the second semiconductor region and the first semiconductor region, a body region of the second conductivity type;
forming a gate trench that penetrates the body region and connects with the first semiconductor region; and
filling a gate electrode in the gate trench,
wherein, after the alternate layers of the drift region and the second semiconductor region are formed, an intermediate second conductivity type layer is formed for being deposited over the alternate layers, and
wherein the first semiconductor region is formed by adding a first conductivity type impurity to the intermediate second conductivity type layer.

7. A semiconductor device manufacturing method according to claim 6,
wherein, after the drain region is formed, an intermediate drift region of the first conductivity type is formed over the drain region,
wherein a given trench is formed for penetrating a portion of the intermediate drift region to reach the drain region,
wherein the alternate layers of the drift region and the second semiconductor region are formed by depositing the second semiconductor region inside the given trench,
wherein the intermediate second conductivity type layer is then consecutively formed for being deposited, and
wherein the first semiconductor region is then formed by adding the first conductivity type impurity to the intermediate second conductivity type layer.

8. A semiconductor device manufacturing method comprising the steps of:
forming a drain region of a first conductivity type;
forming, over a surface of the drain region, alternate layers of a drift region of the first conductivity type and a second semiconductor region of a second conductivity type, wherein the alternate layers are substantially orthogonal to the surface of the drain region;
forming, over the drift region, a first semiconductor region of the first conductivity type, wherein the first semiconductor region is broader than the drift region in a direction parallel with the surface of the drain region;
forming, over the second semiconductor region and the first semiconductor region, a body region of the second conductivity type;
forming a gate trench that penetrates the body region and connects with the first semiconductor region; and
filling a gate electrode in the gate trench,
wherein, after the drain region is formed, an intermediate second semiconductor region of the second conductivity type is deposited over the drain region,
wherein a given trench is formed for penetrating a portion of the intermediate second semiconductor region to reach the drain region,
wherein the alternate layers of the drift region and the second semiconductor region are formed by depositing the drift region inside the given trench,
wherein an intermediate first conductivity type layer is then consecutively formed for being deposited,
wherein the first semiconductor region and the body region are formed, along with a second conductivity type connecting region that is formed as one of an extended portion of the second semiconductor region and an extended portion of the body region, at least by adding a second conductivity type impurity to the intermediate first conductivity type layer.

9. A semiconductor device manufacturing method comprising the steps of:
forming a drain region of a first conductivity type;
forming, over a surface of the drain region, alternate layers of a drift region of the first conductivity type and a second semiconductor region of a second conductivity type, wherein the alternate layers are substantially orthogonal to the surface of the drain region;
forming, over the drift region, a first semiconductor region of the first conductivity type, wherein the first semiconductor region is broader than the drift region in a direction parallel with the surface of the drain region;
forming, over the second semiconductor region and the first semiconductor region, a body region of the second conductivity type;
forming a gate trench that penetrates the body region and connects with the first semiconductor region; and
filling a gate electrode in the gate trench,
wherein, after the alternate layers of the drift region and the second semiconductor region are formed, an intermediate first conductivity type layer is formed by adding a first conductivity type impurity to upper portions of the alternate layers, and
wherein the first semiconductor region and the body region are formed, along with a second conductivity type connecting region that is formed as one of an extended portion of the second semiconductor region and an extended portion of the body region, at least by adding a second conductivity type impurity to the intermediate first conductivity type layer.

10. A semiconductor device manufacturing method comprising the steps of:
forming a drain region of a first conductivity type;
forming, over a surface of the drain region, alternate layers of a drift region of the first conductivity type and a second semiconductor region of a second conductivity type, wherein the alternate layers are substantially orthogonal to the surface of the drain region;
forming, over the drift region, a first semiconductor region of the first conductivity type, wherein the first semiconductor region is broader than the drift region in a direction parallel with the surface of the drain region;
forming, over the second semiconductor region and the first semiconductor region, a body region of the second conductivity type;
forming a gate trench that penetrates the body region and connects with the first semiconductor region; and
filling a gate electrode in the gate trench,
wherein, after the drain region is formed, an intermediate drift region of a first conductivity type is formed over the drain region,
wherein a given trench is formed for penetrating a portion of the intermediate drift region to reach the drain region, wherein the alternate layers of the drift region and the second semiconductor region are formed by depositing the second semiconductor region inside the given trench, wherein an intermediate second conductivity type layer is then consecutively formed for being deposited, and wherein the first semiconductor region is then formed, along with the body region and a second conductivity type connecting region that is formed as one of an extended portion of the second semiconductor region and an extended portion of the body region, at least by adding a first conductivity type impurity to a portion of the intermediate second conductivity type layer.

11. A semiconductor device manufacturing method comprising the steps of:

forming a drain region of a first conductivity type;

forming, over a surface of the drain region, alternate layers of a drift region of the first conductivity type and a second semiconductor region of a second conductivity type, wherein the alternate layers are substantially orthogonal to the surface of the drain region;

forming, over the drift region, a first semiconductor region of the first conductivity type, wherein the first semiconductor region is broader than the drift region in a direction parallel with the surface of the drain region;

forming, over the second semiconductor region and the first semiconductor region, a body region of the second conductivity type;

forming a gate trench that penetrates the body region and connects with the first semiconductor region; and filling a gate electrode in the gate trench, wherein a connecting region that is the second conductivity type and reaches the second semiconductor region is formed by adding a second conductivity type impurity to a portion of the first semiconductor region, after the step of forming the first semiconductor region, and wherein the body region of the second conductivity type is formed in such a manner that the body region is deposited over the first semiconductor region and the connecting region.

12. A semiconductor device manufacturing method according to claim 11, wherein the step of forming the first semiconductor region is forming the first semiconductor region in such a manner that the first semiconductor region is deposited over the alternate layers of the drift region and the second semiconductor region.

13. A semiconductor device manufacturing method according to claim 12, wherein the step of forming the first semiconductor region is performed in such a manner that the first semiconductor region is deposited consecutively after the steps of:

forming the second semiconductor region of the second conductivity type in such a manner that the second semiconductor region is deposited over the drain region of the first conductivity type;

forming a given trench for penetrating a portion of the second semiconductor region to reach the drain region; and forming the alternate layers where the drift region and the second semiconductor region are horizontally alternated, by depositing the drift region of the first conductivity type inside the given trench.

14. A semiconductor device manufacturing method according to claim 11, wherein the step of forming the first semiconductor region is performed by forming a second conductivity type layer in such a manner that the second conductivity type layer is deposited over the alternate layers of the drift region and the second semiconductor region and then adding a first conductivity type impurity to a portion of the second conductivity type layer.

15. A semiconductor device manufacturing method according to claim 11, wherein the step of forming the first semiconductor region is performed by adding a first conductivity type impurity to upper portions of the alternate layers of the drift region and the second semiconductor region.

16. A semiconductor device manufacturing method according to claim 11, wherein, after the step of forming the drain region, the drift region of the first conductivity type is formed over the drain region of the first conductivity type, wherein a given trench is formed for penetrating a portion of the drift region to reach the drain region, wherein the alternate layers of the drift region and the second semiconductor region are formed by depositing the second semiconductor region inside the given trench, wherein a second conductivity type layer is consecutively formed in such a manner that the second conductivity type layer is deposited over the alternate layers, and wherein the first semiconductor region is formed by adding a first conductivity type impurity to a portion of the second conductivity type layer.

17. A semiconductor device manufacturing method comprising the steps of:

forming a drain region of a first conductivity type;

forming, over a surface of the drain region, alternate layers of a drift region of the first conductivity type and a second semiconductor region of a second conductivity type, wherein the alternate layers are substantially orthogonal to the surface of the drain region;

forming, over the drift region, a first semiconductor region of the first conductivity type, wherein the first semiconductor region is broader than the drift region in a direction parallel with the surface of the drain region;

forming, over the second semiconductor region and the first semiconductor region, a body region of the second conductivity type;

forming a gate trench that penetrates the body region and connects with the first semiconductor region; and filling a gate electrode in the gate trench, wherein a first conductivity type layer is formed by adding a first conductivity type impurity to upper portions of the alternate layers after the step of forming the alternate layers of the drift region and the second semiconductor region, and wherein a connecting region of the second conductivity type, the first semiconductor region of the first conductivity type, and the body region of the second conductivity type are formed by adding at least a second conductivity type impurity to portions of the first conductivity type layer.

18. A semiconductor device manufacturing method comprising the steps of:

forming a drain region of a first conductivity type;

forming, over a surface of the drain region, alternate layers of a drift region of the first conductivity type and a second semiconductor region of a second conductivity type, wherein the alternate layers are substantially orthogonal to the surface of the drain region;

forming, over the drift region, a first semiconductor region of the first conductivity type, wherein the first semiconductor region is broader than the drift region in a direction parallel with the surface of the drain region;

forming, over the second semiconductor region and the first semiconductor region, a body region of the second conductivity type;

forming a gate trench that penetrates the body region and connects with the first semiconductor region; and filling a gate electrode in the gate trench, wherein, after the step of forming the drain region, the drift region of the first conductivity type is formed over the drain region of the first conductivity type, wherein a given trench is formed for penetrating a portion of the drift region to reach the drain region, wherein a second conductivity type layer is consecutively formed in such a manner that the second conductivity type layer is deposited over the alternate layers, after the alternate layers of the drift region and the second semiconductor region are formed by depositing the second semiconductor region inside the given trench, and wherein the first semiconductor region of the first conductivity type, a connecting region of the second conductivity type, and the body region of the second conductivity type are formed by adding at least a first conductivity type impurity to portions of the second conductivity type layer.

19. A semiconductor device manufacturing method comprising the steps of:

forming a drain region of a first conductivity type;

forming, over a surface of the drain region, alternate layers of a drift region of the first conductivity type and a second semiconductor region of a second conductivity type, wherein the alternate layers are substantially orthogonal to the surface of the drain region;

forming, over the drift region, a first semiconductor region of the first conductivity type, wherein the first semiconductor region is broader than the drift region in a direction parallel with the surface of the drain region;

forming, over the second semiconductor region and the first semiconductor region, a body region of the second conductivity type;

forming a gate trench that penetrates the body region and connects with the first semiconductor region; and filling a gate electrode in the gate trench, wherein, after the step of forming the drain region, the second semiconductor region of the second conductivity type is formed over the drain region of the first conductivity type, wherein a first trench is formed in an upper portion of the second semiconductor region, wherein a second trench that is under the first trench and adjoins a bottom of the first trench is formed for penetrating the second semiconductor region to reach the drain region, wherein the second trench is narrower in width than the first trench, wherein the drift region of the first conductivity type is formed in such a manner that the drift region is deposited inside the second trench, and wherein the first semiconductor region of the first conductivity type is consecutively formed in such a manner that the first semiconductor region is deposited inside the first trench.

* * * * *